United States Patent
Dixon

(10) Patent No.: US 7,449,265 B1
(45) Date of Patent: Nov. 11, 2008

(54) SCATTEROMETRY TARGET FOR DETERMINING CD AND OVERLAY

(75) Inventor: David Dixon, Austin, TX (US)

(73) Assignee: Tokyo Electron Limited (JP)

( * ) Notice: Subject to any disclaimer, the term of this patent is extended or adjusted under 35 U.S.C. 154(b) by 0 days.

(21) Appl. No.: 11/943,286

(22) Filed: Nov. 20, 2007

(51) Int. Cl.
*G03F 9/00* (2006.01)

(52) U.S. Cl. .......................... 430/22; 257/797; 356/401; 430/5; 430/30

(58) Field of Classification Search .................. 430/5, 430/22, 30; 257/797; 356/401
See application file for complete search history.

(56) References Cited

U.S. PATENT DOCUMENTS

| | | |
|---|---|---|
| 2004/0066517 A1 | 4/2004 | Huang et al. |
| 2004/0137651 A1 | 7/2004 | Smedt et al. |
| 2004/0218179 A1 | 11/2004 | Norton et al. |
| 2004/0246482 A1 | 12/2004 | Sezginer et al. |
| 2005/0012928 A1 | 1/2005 | Sezginer et al. |
| 2005/0018190 A1 | 1/2005 | Sezginer et al. |
| 2005/0089773 A1 | 4/2005 | Shur et al. |
| 2005/0122516 A1 | 6/2005 | Sezginer et al. |
| 2005/0174575 A1 | 8/2005 | Norton et al. |
| 2005/0231732 A1 | 10/2005 | Monshouwer et al. |
| 2005/0286051 A1 | 12/2005 | Sezginer et al. |
| 2006/0073686 A1 | 4/2006 | Zach et al. |
| 2006/0082792 A1 | 4/2006 | Sezginer |

*Primary Examiner*—Christopher G Young

(57) ABSTRACT

The invention can provide a method of processing a wafer using segmented multi-dimensional targets that can be used in Double-Patterning (D-P) procedures.

20 Claims, 7 Drawing Sheets

SCATTEROMETRY TARGET FOR DETERMINING CD AND OVERLAY

CROSS-REFERENCE TO RELATED APPLICATIONS

Not Applicable

BACKGROUND OF THE INVENTION

1. Field of the Invention

The present invention relates to wafer processing, and more particularly to improving the wafer processing using multi-dimensional targets.

2. Description of the Related Art

Many multiple patterning techniques are currently being use during semiconductor wafer processing to increase the number of features and/or structures within devices on a wafer. Multiple patterning techniques can include double exposure techniques, double patterning techniques, spacer techniques, mask techniques, and brute force techniques. In 2006, the International Technology Roadmap for Semiconductors was expanded to include double patterning as a potential solution for 32 nm (nanometer) lithography. Multiple patterning techniques are viewed by some device manufacturers as bridge solutions that can be used until Extreme Ultra-Violet (EUV) techniques become more fully developed.

SUMMARY OF THE INVENTION

The invention can provide apparatus and methods of processing a wafer in real-time using multi-dimensional targets that can be used in Double-Patterning (D-P) procedures and D-P libraries to control transistor structures.

Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The present invention provides apparatus and methods for performing Double-Patterning (D-P) processing sequences using multi-dimensional targets, and the D-P processing sequences can include one or more lithography-related procedures, one or more scanner-related procedures, one or more etch-related procedures, one or more deposition-related procedures, one or more measurement-related procedures, or one or more inspection-related procedures, or any combination thereof.

One or more multi-dimensional targets can be provided at various locations on a wafer and can be used to align D-P layers and/or verify D-P procedures. Wafers can have wafer data associated with them, and the wafer data can include real-time and historical data. In addition, the wafer can have other data associated with them, and the other data can include D-P pattern data, alignment data, overlay data, confidence data and/or risk data for one or more of the D-P patterns and/or sites, site ranking data, transferring sequence data, or process-related data, or evaluation/verification-related data, or any combination thereof. The data associated with D-P wafers can include data that can be used to establish how to align D-P layers. D-P processing sequences can also be established for each D-P wafer.

In some examples, the wafers can have other layers deposited on them by a previous process or an external system, and the D-P sequences can include one or more lithography-related procedures, one or more scanner-related procedures, one or more evaluation procedures, and one or more transfer sequences. For example, transfer sequences can be established based on the number of wafers that require lithography-related processing, the number of wafers that require scanner-related processing, the number of available processing elements, the number of wafers that require evaluation, the number of available evaluation elements, and the loading data for one or more of the subsystems.

As structure sizes decrease below the 65 nm node, accurate processing and/or measurement data becomes more important and more difficult to obtain. D-P procedures can be used to more accurately process and/or measure these ultra-small devices and structures. The data from a D-P procedure can be compared with the warning and/or control limits, when a run-rule is violated, an alarm can be generated indicating a processing problem, and real-time correction procedures can be performed.

Figure 1:
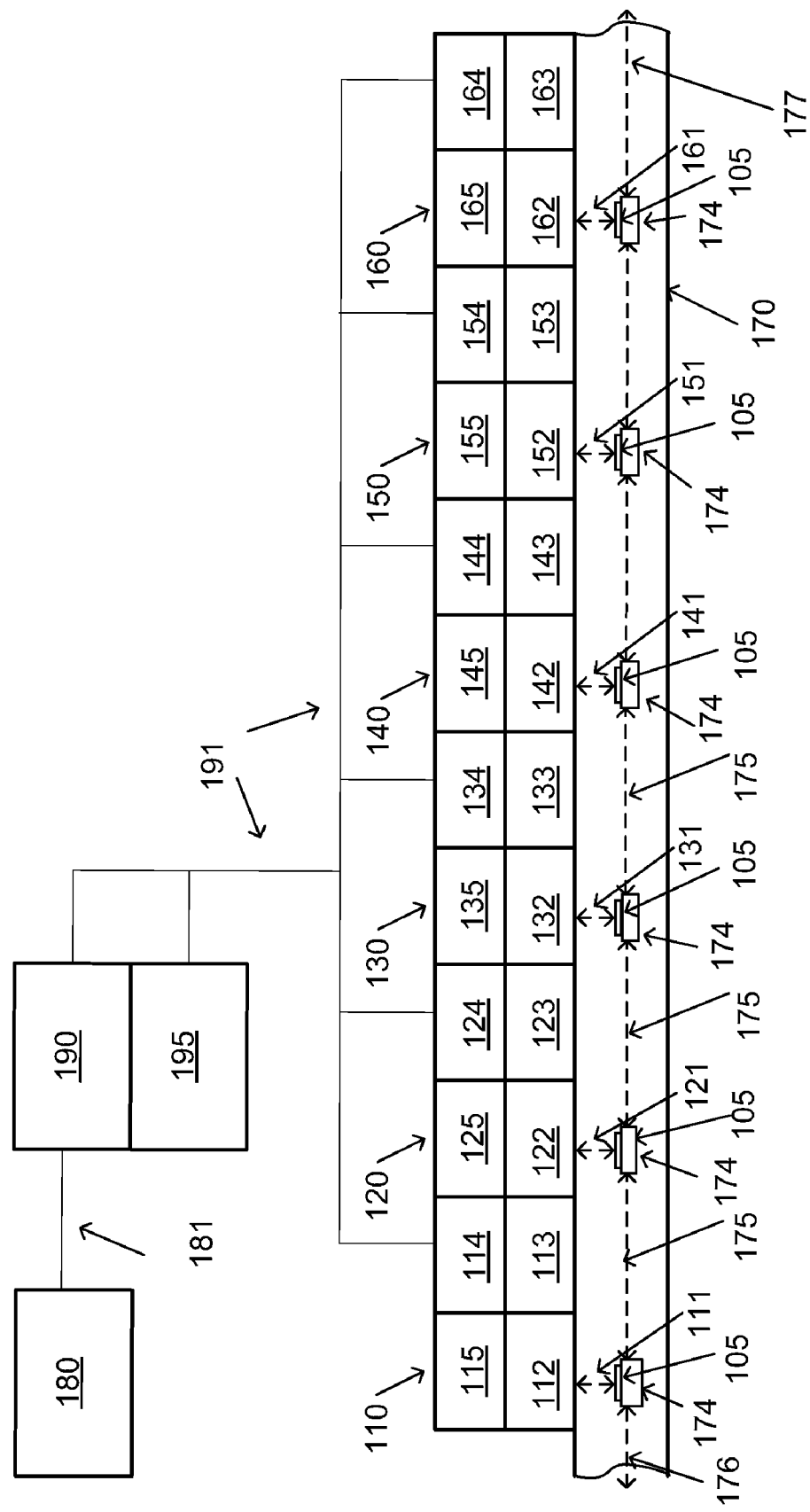
FIG. 1 shows an exemplary block diagram of a processing system in accordance with embodiments of the invention.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, a metrology subsystem 150, an inspection subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In addition, one or more of the subsystems (110, 120, 130, 140, 150, 160, and 170) can comprise one or more processing elements that can be used to perform one or more D-P procedures.

The system controller 190 can be coupled to the lithography subsystem 110, the scanner subsystem 120, the etch subsystem 130, the deposition subsystem 140, the metrology subsystem 150, the inspection subsystem 160, and the transfer subsystem 170 using a data transfer subsystem 191. The system controller 190 can be coupled to the MES 180 using the data transfer subsystem 181. Alternatively, other configurations may be used. For example, the etching subsystem 130, the deposition subsystem 140, the metrology subsystem 150, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled 111 to the transfer subsystem 170. The transfer subsystem 170 can be coupled 111 to the lithography subsystem 110, and one or more wafers 105 can be transferred 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more wafers. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to measure and/or inspect one or more of the masking layers and/or wafers.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled 121 to the transfer subsystem 170. The transfer subsystem 170 can be coupled 121 to the scanner subsystem 120, and one or more wafers 105 can be transferred 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled 131 to the transfer subsystem 170. The transfer subsystem 170 can be coupled 131 to the etch subsystem 130, and one or more wafers 105 can be transferred 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, and cleaning procedures, or plasma or non-plasma trimming procedures. Evaluation procedures and/or inspection procedures can be used to measure and/or inspect one or more surfaces and/or layers of the wafers.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled 141 to the transfer subsystem 170. The transfer subsystem 170 can be coupled 141 to the deposition subsystem 140, and one or more wafers 105 can be transferred 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the wafers.

The deposition subsystem 140 can comprise one or more processing elements 143 that can process, measure, inspect, align, and/or store one or more wafers. The transfer/storage elements 142 can transfer, measure, inspect, align, and/or store one or more wafers. In some embodiments, the deposition subsystem 140 can comprise one or more evaluation elements 145 that can perform inspection procedures, measurement procedures, alignment procedures, and/or storage procedures on one or more wafers.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled 151 to the transfer subsystem 170. The transfer subsystem 170 can be coupled 151 to the inspection subsystem 150, and one or more wafers 105 can be transferred 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled 161 to the transfer subsystem 170. The transfer subsystem 170 can be coupled 161 to the metrology subsystem 160, and one or more wafers 105 can be transferred 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to one or more of the processing elements 163, and/or to one or more of the evaluation elements 165.

The metrology subsystem 160 can comprise one or more evaluation elements 165 that can evaluate, measure, inspect, align, verify, and/or store one or more wafers. For example, one or more of the evaluation elements 165 can be used to perform real-time optical metrology procedures that can be used to measure D-P patterns and/or thicknesses on the wafer.

The transfer subsystem 170 can comprise transfer elements 174 that can be used to receive wafers, transfer wafers, align wafers, store wafers, and/or delay wafers. For example, the transfer elements 174 can support two or more wafers. Alternatively, other transferring means may be used. The transfer subsystem 170 can load, transfer, store, and/or unload D-P wafers based on a processing sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof. For example, the sites on the wafer can include target sites, overlay sites, alignment sites, measurement sites, verification sites, inspection sites, or damage-assessment sites, or any combination thereof.

In some examples, transfer system 170 can use loading data to determine where to transfer a wafer. In other examples, a transfer system can use D-P processing sequence data to determine where to transfer a wafer. In still other examples, a transfer system can use confidence data to determine where to transfer a wafer. Alternatively, other procedures may be used. For example, when the first number of wafers is less than or equal to the first number of available processing elements, the first number of wafers can be transferred to the first number of available processing elements in the one or more of the subsystems using the transfer subsystem 170. When the first number of wafers is greater than the first number of available processing elements, some of the wafers can be stored using one or more of the transfer/storage elements (112, 122, 132, 142, 152, and 162) and/or the transfer subsystem 170.

In some embodiments, one or more of the subsystems (110, 120, 130, 140, 150, 160, and 170) can perform cleaning procedures, etching procedures, layer removal procedures, ashing procedures, inspection procedures, residue removal procedures, measurement procedures, alignment procedures, and/or storage procedures on one or more wafers using reworking procedures. For example, material can be removed from one or more patterned wafers using one or more plasma etching procedures, and/or non-plasma etching procedures. In addition, one or more processing subsystems can be used to remove damaged material from one or more of the wafers. Each subsystem can process one or more wafers in parallel.

In addition, the one or more processing elements (113, 123, 133, 143, 153, and 163) can include one or more lithography-related components, one or more scanner-related components, one or more inspection-related components, one or more measurement-related components, one or more evaluation-related components, one or more etch-related components, one or more deposition-related components, one or more thermal processing components, one or more coating-related components, one or more alignment-related components, one or more polishing-related components, one or more storage-related components, one or more transfer components, one or more cleaning-related components, one or more rework-related components, one or more oxidation-related components, one or more nitridation-related components, or one or more external processing elements, or any combination thereof.

Operational state data can be established for the subsystems (110, 120, 130, 140, 150, 160, and 170) and can be used and/or updated by D-P procedures. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by D-P procedures. For example, the operational state data for the processing elements can include availability data, matching data for the processing elements, expected processing times for some process steps and/or sites, confidence data and/or risk data for the processing elements, or confidence data and/or risk data for one or more D-P procedures. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include 8-bit, 16-bit, 32-bit, and/or 64-bit processors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, and 190) can be coupled to external devices as required.

One or more of the controllers (114, 124, 134, 144, 154, 164, and 190) can be used when performing real-time D-P procedures. A controller can receive real-time data to update subsystem, processing element, process, recipe, profile, image, pattern, and/or model data. One or more of the controllers (114, 124, 134, 144, 154, 164, and 190) can be used to exchange one or more Semiconductor Equipment Communications Standard (SECS) messages with the MES 180, read and/or remove information, feed forward, and/or feedback the information, and/or send information as a SECS message. In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL). In other embodiments, external subsystems and/or tools may be included. One or more of the subsystems (110, 120, 130, 140, 150, 160, and 170) may include one or more etch elements, deposition elements, integrated-metrology (IM) elements, Atomic Layer Deposition (ALD) elements, measurement elements, ionizations elements, polishing elements, coating elements, developing elements, cleaning elements, exposure elements, and thermal treatment elements. In addition, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system. The subsystems and/or processing elements can have different interface requirements, and the controllers can be configured to satisfy these different interface requirements.

One or more of the subsystems (110, 120, 130, 140, 150, 160, and 170) can comprise control applications, Graphical User Interface (GUI) components, and/or database components. In addition, one or more of the subsystems (110, 120, 130, 140, 150, 160, and 170) and/or controllers (114, 124, 134, 144, 154, 164, and 190) can include Advanced Process Control (APC) applications, Advanced Equipment Control (AEC), Fault Detection and Classification (FDC), and/or Run-to-Run (R2R) applications. In some embodiments, APC applications, AEC applications, FDC applications, and/or R2R applications can be performed.

Output data and/or messages from D-P procedures can be used in subsequent procedures to optimize the process accuracy and precision. Data can be passed to D-P procedures in real-time as real-time variable parameters, overriding current model default values and narrowing the search space for resolving accurate results. Real-time data can be used with a library-based system, or regression-based system, or any combination thereof to optimize a D-P procedure.

In some embodiments, the metrology subsystem 160 can include integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than approximately 150 nm to greater than approximately 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. An exemplary optical metrology system is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference.

Simulated diffraction signals can be generated by applying Maxwell's equations and using a numerical analysis technique to solve Maxwell's equations. For example, various numerical analysis techniques, including variations of rigorous coupled wave analysis (RCWA), can be used with multilayer structures. For a more detail description of RCWA, see U.S. Pat. No. 6,891,626, titled CACHING OF INTRA-LAYER CALCULATIONS FOR RAPID RIGOROUS COUPLED-WAVE ANALYSES, filed on Jan. 25, 2001, issued May 10, 2005, which is incorporated herein by reference in its entirety.

An alternative procedure for generating a library of simulated-diffraction signals can include using a machine learning system (MLS). Prior to generating the library of simulated-diffraction signals, the MLS is trained using known input and output data. For example, the MLS may be trained with a subset of the D-P library data. In one exemplary embodiment, simulated diffraction signals can be generated using a MLS employing a machine learning algorithm, such as back-propagation, radial basis function, support vector, kernel regression, and the like. For a more detailed description of machine learning systems and algorithms, see "U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

For detailed description of metrology model optimization, refer to U.S. patent application Ser. No. 10/206,491, OPTIMIZED MODEL AND PARAMETER SELECTION FOR OPTICAL METROLOGY, by Vuong, et al., filed Jun. 27, 2002; 10/946,729, OPTICAL METROLOGY MODEL OPTIMIZATION BASED ON GOALS, by Vuong, et al., filed Sep. 21, 2004; and U.S. patent application Ser. No. 11/061,303, OPTICAL METROLOGY OPTIMIZATION FOR REPETITIVE STRUCTURES, by Vuong, et al., filed on Apr. 27, 2004, all of which are incorporated herein by reference in their entireties.

When a regression-based process is used, a measured diffraction signal measured off the patterned structure can be compared to simulated diffraction signals. The simulated diffraction signals can be iteratively generated based on sets of profile parameters, to get a convergence value for the set of profile parameters that generates the closest match simulated diffraction signal compared to the measured diffraction signal. For a more detailed description of a regression-based process, see U.S. Pat. No. 6,785,638, titled METHOD AND SYSTEM OF DYNAMIC LEARNING THROUGH A REGRESSION-BASED LIBRARY GENERATION PROCESS, issued on Aug. 31, 2004, which is incorporated herein by reference in its entirety.

When a library-based process is used, an optical metrology data library can be generated and/or enhanced using D-P procedures, recipes, profiles, and/or models. For example, a D-P evaluation library can comprise simulated and/or measured optical signals and corresponding set of profile parameters. A detailed description of generating optical metrology data such as a library of simulated diffraction signals and corresponding set of profile parameters is described in U.S. Pat. No. 6,913,900, entitled GENERATION OF A LIBRARY OF PERIODIC GRATING DIFFRACTION SIGNAL, by Niu, et al., issued on Sep. 13, 2005, and is incorporated in its entirety herein by reference. The regression-based and/or the library-based process can include D-P procedures.

One or more of the controllers (114, 124, 134, 144, 154, 164, and 190) can perform APC, AEC, R2R, FDC, and/or D-P procedures that can be context dependent and can operate as control strategies, control plans, control models, and/or recipe managers to provide real-time processing. Control and/or analysis strategies/plans can cover multiple process steps within a wafer processing sequence, and can be used to analyze the real-time and/or collected data, and establish error conditions. An analysis procedure can be executed when a context is matched. During the execution of an analysis procedure, one or more analysis plans can be executed. A plan can create an error when a data failure occurs, an execution problem occurs, or a control problem occurs. A data collection plan and/or analysis plan can reject the data at one or more of the sites for a wafer or reject the data because a procedure fails. For example, dynamic context matching allows for custom configuration at each device and/or product.

Intervention and/or judgment rules can be defined in a strategy, plan, model, subsystem, element, or procedure and can be assigned to execute whenever a matching context is encountered. The intervention and/or judgment rules can be established for various D-P procedures and can be maintained in the database.

In one embodiment, a procedure failure may not terminate a D-P procedure. For example, a D-P procedure can indicate a failure when a limit is exceeded. Successful procedures can create warning messages when limits are being approached. Pre-specified failure actions for procedures errors can be stored in a database, and can be retrieved from the database when an error occurs.

In some embodiments, one or more of the evaluation elements (115, 125, 135, 145, 155, and 165) can perform evaluation procedures, inspection procedures, temperature control procedures, measurement procedures, alignment procedures, verification procedures, and/or storage procedures on one or more wafers. One or more of the evaluation elements (115, 125, 135, 145, 155, and 165) can be used to determine wafer temperature, wafer thickness, layer thickness, wafer uniformity, pattern thickness, pattern errors, or overlay errors, any combination thereof. In addition, one or more of the evaluation elements (115, 125, 135, 145, 155, and 165) can be used to determine wafer curvature or to measure and/or inspect one or more surfaces of the wafers. One or more of the evaluation elements (115, 125, 135, 145, 155, and 165) can perform evaluation procedures to determine if the wafer has been processed correctly or if a rework procedure is required.

One or more of the formatted messages can be exchanged between subsystems. The controllers can process messages and extract new data. When new data is available, a controller can either use the new data to update a D-P procedure currently being used for the wafer and/or lot. When the controller uses the new data to update D-P procedure data for the wafer lot currently being processed, the controller can determine if a D-P procedure can be updated before the current wafer is processed. The current wafer can be processed using the updated D-P procedure when the D-P procedure can be updated before the current wafer is processed. The current wafer can be processed using a non-updated D-P procedure when the data cannot be updated before the current wafer is processed.

One or more D-P procedures can provide damage-assessment data that can include data for damaged patterns, features, and/or structures for different sites, wafers, and/or lots. One or more processing subsystems can use the damage-assessment data to update, and/or optimize processing recipe data, process profile data, and/or modeling data. For example, the etching subsystem 130 can use "protection layer" data to update, and/or optimize an etching chemistry and/or etching time.

D-P procedures can be used to create, modify, and/or evaluate isolated and/or nested structures at different times and/or sites. For example, pattern layer and/or wafer thickness data can be different near isolated and/or nested structures, and wafer thickness data can be different near open areas and/or trench array areas. A processing subsystem can use new data for isolated and/or nested structures to update and/or optimize a process recipe and/or process time.

D-P procedures can use end-point detection (EPD) data and process time data to improve the accuracy. When EPD data is used to stop a D-P procedure, the EPD time data and the process rate data can be used to estimate pattern and/or wafer thicknesses.

Metrology subsystem 160 data can include measured and/or simulated signals associated with D-P patterns or structures, and the signals can be stored using processing, wafer, lot, recipe, site, or wafer location data. Measurement data can include variables associated with patterned structure profile, metrology device type and associated variables, and ranges used for the variables floated in the modeling and values of variables that were fixed in the modeling. The library data may include fixed and/or variable profile parameters (such as CD, sidewall angle, refractive index (n) data and extinction coefficient (k) data), and/or metrology device parameters (such as wavelengths, angle of incidence, and/or azimuth angle).

Inspection subsystem 160 data can include measured, calculated, and/or simulated signals associated with aligned targets, un-aligned targets, patterned overlay structures, and the signals can be stored using processing, wafer, lot, recipe, site, or wafer location data. Inspection data can include variables associated with patterned structures, targets, inspection device type and associated variables, and ranges used for the variables floated in the modeling and values of variables that were fixed in the modeling. The library data may include fixed and/or variable profile parameters.

In some embodiments, D-P procedures can use measured, predicted, and/or simulated data. D-P procedures may utilize context/identification information such as site ID, wafer ID, slot ID, lot ID, recipe, state, and patterned structure ID as a means for organizing and indexing data. In some examples, the library data can include verified data associated with products, devices, wafers, procedures, lots, recipes, sites, locations, patterned and/or un-patterned structures.

In some examples, the MES 180 may be configured to monitor some D-P and/or system processes, and factory level intervention and/or judgment rules can be used to determine which processes are monitored and which data can be used. In addition, factory level intervention and/or judgment rules can be used to determine how to manage the data when a process can be changed, paused, and/or stopped. In addition, the MES 180 can provide configuration information and update information. Data can be exchanged using SEMI Equipment Communications Standard/Generic Equipment Model (SECS/GEM) communications protocols.

The confidence data can include an assessment of each process that was performed on the wafer. When processing data from a procedure is close to expected values, the confidence value for that procedure can be high, and when processing data from a procedure is not close to the expected values, the confidence value for that procedure can be low. For example, confidence values can range from zero to nine, where zero indicates a failure condition and nine indicates a correct performance.

The processing system 100 can be used to perform and/or verify one or more D-P procedures. In some embodiments, one or more wafers can be received by one or more transfer subsystems 170, and the transfer subsystems 170 can transfer one or more of the wafers to one or more of the subsystems (110, 120, 130, 140, and 150) in the processing system 100. One or more of the controllers (114, 124, 134, 144, 154, 164, and 190) can be configured for determining wafer data for each wafer, for determining one or more D-P procedures using historical data and/or the real-time data, for establishing one or more D-P procedures, for establishing a first number of wafers to be processed using the D-P procedure, for determining operational state data for the one or more subsystems (110, 120, 130, 140, 150, 160, and 170), for determining loading data for the one or more transfer elements 174 in the one or more transfer subsystems 170.

In other embodiments, one or more chamber-matching procedures can be performed during a D-P sequence. When one or more first chamber-matching procedures are performed, chamber-matching data can be obtained from one or more of the processing elements (113, 123, 133, 143, 153, and 163) and/or from one or more of the evaluation elements (115, 125, 135, 145, 155, and 165). Chamber matching data can be used to determine alignment errors, confidence values, and risk factors during the D-P procedure. For example, when a D-P pattern is created on a first wafer, real-time evaluation, measurement, and/or inspection data can be obtained for the first wafer and the associated chambers, and when the D-P pattern is created on a second wafer, real-time evaluation, measurement, and/or inspection data can be obtained for the second wafer and associated chambers, and one or more chamber-matching values can be determined using the obtained data. In addition, chamber-matching procedures can be performed using one or more "golden wafers" that can be stored and used periodically to verify the performance of one or more of the chambers. Furthermore, one or more reference chips associated with a measurement, evaluation, and/or inspection chamber may be used.

For example, real-time chamber-matching data can include pattern data, alignment data, overlay data, material data, critical dimension (CD) data, sidewall angle (SWA) data, structure data, or thickness data, or any combination thereof. In addition, data in a D-P evaluation library can be updated using the first real-time chamber-matching data when library creation rules are not violated.

In various examples, product requirement data for a D-P procedure can be obtained by performing the D-P procedure in a "golden" processing chamber, can be historical data that is stored in a library, can be obtained by performing a verified D-P procedure, can be obtained from the MES 180, can be simulation data, and can be predicted data. Multi-input multi-output (MIMO) models can be established and/or used to predict product requirement data for one or more patterned layers. Some MIMO models can be established and/or used to predict thickness and/or uniformity data for one or more deposited layers using measurement data for one or more previously created layers.

When multiple chambers and/or wafers are used, a first wafer can be transferred to a first processing element, and can be processed using a first D-P procedure, and a second wafer can be transferred to a second processing element and can be processed using the first D-P procedure or a modified version of the first D-P procedure. The modified version can include changes established using chamber matching data, recipe update data, feedback data, feed forward data, or any combination thereof.

In some examples, a first D-P layer can be created on first and second wafers using a first D-P sequence or an updated/modified first D-P sequence. Measurement data can be obtained for the first and second wafers, and first correction data can be determined using the difference between reference data and the measured data from the first and/or second wafers. The first correction data can be used to update the first D-P sequence when the correction data is less than or equal to a correction limit. Next, the second D-P layer can be created on the first and second wafers using a second D-P sequence or an updated/modified second D-P sequence. Measurement data can be obtained for the first and second wafers, and second D-P sequence correction data can be determined using the difference between reference data and the measured data from the first and/or second wafers. The second D-P sequence correction data can be used to update the second D-P sequence when the second D-P sequence correction data is less than or equal to a D-P sequence correction limit. In addition, the second D-P sequence correction data can be used to update the first D-P sequence when the second D-P sequence correction data is less than or equal to a D-P sequence correction limit.

When some D-P library data is created, one or more of the subsystems (110, 120, 130, 140, 150, 160, and 170) can be used to create one or more patterned layers on one or more wafers, and the one or more patterned layers can include one or more of gate structures and/or one or more evaluation structures. D-P library data can be obtained from one or more of the subsystems (110, 120, 130, 140, 150, 160, and 170) during the creation sequence. For example, one or more patterned layers created on one or more underlying layers can be measured with a metrology device and/or inspection device, and the D-P library data can include image data, signal data, profile shape data, or process data, or any combination thereof. One or more of the controllers (114, 124, 134, 144, 154, 164, and 190) can be used to compare the obtained data to the data already in one or more D-P libraries. When a matching condition is found, one or more of the D-P patterns and/or structures can be identified using the library data associated with a matching condition. When a matching condition is not found, one or more of the D-P patterns and/or structures can be identified as un-verified D-P patterns and/or structures and the data associated with them can be stored as un-verified data.

Wafer 105 can be, for example, a semiconductor substrate, a work piece, or a liquid crystal display (LCD).

When a D-P procedure is performed, one or more of the controllers (114, 124, 134, 144, 154, 164, and 190) can be used to determine if the D-P procedure is a verified procedure. In some examples, verification decisions for a D-P procedure can be made using the data from a first site, and the first site can be selected from the number of evaluation and/or verification sites on the first D-P wafer. The first site can have a first D-P pattern associated therewith that was created using the D-P procedure. D-P evaluation data can be obtained from a target pattern at a first site on the first D-P wafer, and the target pattern at the first site can have first D-P measurement, process, and/or inspection data associated therewith. For example, D-P measurement, process, and/or inspection data can be obtained from one or more of the subsystems (110, 120, 130, 140, 150, 160, and 170). In addition, first D-P verification data can be established using a verified target pattern for the first site on the first D-P wafer, and the first D-P verification data can include verified D-P measurement and/or inspection data that can be obtained from a D-P evaluation library and/or database. Confidence data and/or risk data can be established for the first target pattern using a first difference between the D-P evaluation data and the D-P verification data. The D-P procedure can be identified as a verified D-P procedure when a first verification limit is met, and the D-P procedure can be identified as an un-verified D-P procedure when a first verification limit is not met. For example, the D-P procedures can have confidence data, risk data, and/or verification data associated therewith.

In other examples, when a D-P procedure is being verified, additional sites can be used on the first D-P wafer. For example, verification decisions can be made using the data from a first site and data from one or more additional sites on the first D-P wafer. When a new site is required, a new site can be selected from the number of evaluation sites on the first D-P wafer, and the new site can have a new target pattern associated therewith that was created using the D-P procedure. D-P evaluation data can be obtained from the new evaluation site on the first D-P wafer, and the new site can have new D-P measurement and/or inspection data associated therewith. For example, new D-P measurement and/or inspection data can be obtained from one or more of the subsystems (110, 120, 130, 140, and 170). In addition, new D-P verification data can be established for the new site on the first D-P wafer, and the new D-P verification data can include new verified D-P measurement and/or inspection data that can be obtained from a D-P evaluation library and/or database. New confidence data and/or risk data can be established for the new site using a new difference between the new D-P evaluation data and the new D-P verification data. The D-P procedure can be identified as a verified D-P procedure when a new verification limit is met, and the D-P procedure can be identified as an un-verified D-P procedure when the new verification limit is not met.

In still other examples, when a D-P procedure is being verified, evaluated, and/or performed, sites on additional D-P wafers can be used. For example, verification decisions can be made using the data from sites on one or more D-P wafers. One or more of the controllers (114, 124, 134, 144, 154, 164, and 190) can also be configured for establishing an additional D-P evaluation procedure for an additional D-P wafer.

In addition, the D-P procedure can be performed in real-time and can include one or more lithography-related procedures, one or more scanner-related procedures, one or more inspection-related procedures, one or more measurement-related procedures, one or more evaluation-related procedures, one or more etch-related procedures, one or more COR procedures, one or more deposition-related procedures, one or more thermal processing procedures, one or more coating-related procedures, one or more alignment-related procedures, one or more polishing-related procedures, one or more storage-related procedures, one or more transfer procedures, one or more cleaning-related procedures, one or more rework-related procedures, one or more oxidation-related procedures, one or more nitridation-related procedures, or one or more external procedures, or any combination thereof.

In some embodiments, the data used to evaluate/verify a D-P procedure and/or target pattern can include intensity data, transmission data, absorption data, reflectance data, diffraction data, optical properties data, or image data, or any combination thereof. The verification data can include historical data, real-time data, optical metrology data, imaging data, particle data, CD-scanning electron microscope (CD-SEM) data, transmission electron microscope (TEM) data, and/or focused ion beam (FIB) data. The threshold limit data can include goodness of fit data, CD data, accuracy data, wavelength data, sidewall data, particle data, process data, historical data, or a combination thereof.

The wafers 105 can include one or more layers that can include semiconductor material, carbon material, dielectric material, glass material, ceramic material, metallic material, oxidized material, mask material, or planarization material, or a combination thereof.

When a product is being developed, one or more D-P libraries can be created, refined, updated, and/or used, and the D-P libraries can include patterns, features, properties, structures, procedures, images, and/or optical data. The processing system 100 can use D-P procedures and/or D-P evaluation procedures to create data for one or more evaluation libraries. In some embodiments, D-P library can be created, refined, and/or verified during a D-P sequence or D-P procedure. For example, one or more "golden" subsystems and/or "golden" processing elements may be used during D-P processing. In addition, transfer and/or processing sequences can be used to eliminated and/or reduce "first wafer effects". In other embodiments, one or more wafers can be processed using a verified D-P procedure. When a verified D-P procedure is performed, verified D-P data can be obtained that can be stored in a D-P library. The D-P library data can segmented multi-dimensional targets and associated data. For example, the data may include diffraction signals and/or spectra, refraction signals and/or spectra, reflection signals and/or spectra, or transmission signals and/or spectra, or any combination thereof. In addition, the D-P library data can include goodness of fit (GOF) data, rules data, measurement data, inspection data, verification data, map data, confidence data.

When segmented multi-dimensional targets are produced and/or examined, accuracy and/or tolerance limits can be used. When these limits are not correct, refinement procedures can be performed. Alternatively, other procedures can be performed, other sites can be used, or other wafers can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

Corrective actions may be used when a error occurs during a D-P procedure, and the corrective actions can include stopping the processing, pausing the processing, re-evaluating one or more of the D-P wafers, re-measuring one or more of the D-P wafers, re-inspecting one or more of the D-P wafers, re-working one or more of the D-P wafers, storing one or more of the D-P wafers, cleaning one or more of the D-P wafers, delaying one or more of the D-P wafers, or stripping one or more of the D-P wafers, or any combination thereof.

Verification-related sequences can be established for verifying sites used in procedures, wafers, procedures, and/or libraries. Verification-related sequences can include creation procedures, transfer procedures, verification procedures, evaluation procedures, measurement procedures inspection procedures, or any combination thereof. Alternatively, procedures may be included. One or more wafers can be processed using one or more process-related procedures and can be verified using the process-verification processing sequence.

In addition, D-P-related data can include gate data, drain data, source data, capacitor data, via data, trench date, two-dimensional memory structure data, three-dimensional memory structure data, SWA data, bottom CD data, top CD data, middle CD data, polygon data, array data, periodic structure data, alignment feature data, doping data, strain data, damaged-structure data, or reference structure data, or any combination thereof.

The D-P processing sequences can include one or more mask creation procedures, one or more deposition procedures, one or more coating procedures, one or more etching procedures, one or more thermal procedures, one or more implanting procedures, one or more doping procedures, one or more exposure procedures, one or more oxidation procedures, one or more nitridation procedures, one or more ionization procedures, one or more development procedures, one or more lithography procedures, one or more scanner-related procedures, one or more measurement procedures, one or more inspection procedures, one or more evaluation procedures, one or more simulation procedures, one or more prediction procedures, one or more rework procedures, one or more storage procedures, one or more transfer procedures, one or more load-lock procedures, or one or more cleaning procedures, or any combination thereof.

When a first (most accurate) alignment threshold limit is met, the structures being produced can be identified as having the highest level of confidence and/or the lowest risk factor associated therewith. When another (less accurate) alignment threshold limit is met, the structures being produced can be identified as having a lower level of confidence and/or a higher risk factor associated therewith. When one or more alignment threshold limits are not met, the structures being produced can be identified as unverified structures having a low level of confidence and/or a high risk factor associated therewith.

In some cases, the sites used and the types of segmented multi-dimensional targets in the D-P procedures can be specified by a semiconductor manufacturer based on data stored in a historical database. For example, a semiconductor manufacturer may have historically chosen a number of sites on the wafer when making SEM measurements and would like to correlate the measurement data, inspection data, and/or evaluation data from one system to the data measured using a SEM system, a TEM system, and/or a FIB system. In addition, the number of measurement or verification sites used in D-P procedures can be reduced as the manufacturer becomes more confident that the process is and will continue to produce high quality spacers and/or devices.

The measurement, inspection, and/or evaluation procedures in a D-P processing sequence can be time consuming and can affect the throughput of a processing system. During process runs, a manufacturer may wish to minimize the amount of time used to measure, inspect, verify, and/or evaluate a wafer. The procedures can be time-dependent, and different procedures may be selected based on their execution time. A smaller number of sites may be used when execution times are too long.

In addition, process result, measurement, inspection, verification, evaluation, and/or prediction maps associated with one or more processes may be used to calculate a confidence map for a wafer. For example, values from another map may be used as weighting factors.

The D-P evaluation sites can include pattern-dependent sites, target-dependent sites, alignment-dependent sites, overlay-dependent sites, process-dependent sites, measurement-dependent sites, inspection-dependent sites, gate-dependent sites, wafer-dependent sites, or product-dependent sites, or any combination thereof. The limit data can include confidence limits, risk limits, pattern-dependent limits, target-dependent limits, alignment-dependent limits, overlay-dependent limits, gate structure limits, accuracy limits, time limits, product requirement limits, measurement limits, inspection limits, simulation limits, prediction limits, or historical limits, or any combination thereof.

In some examples, first confidence and/or risk data can be established for a D-P wafer before, during, and/or after one or more of the first layer creation procedures are performed by the processing system 100, second confidence and/or risk data can be established for the D-P wafer before, during, and/or after one or more evaluation procedures are performed for the first layer by the processing system 100, third confidence and/or risk data can be established for the D-P wafer before, during, and/or after one or more of the second layer creation procedures are performed by the processing system 100, and fourth confidence and/or risk data can be established for the D-P wafer before, during, and/or after evaluation procedures are performed for the second layer by the processing system 100.

In some examples, individual and/or total confidence values for the D-P wafer can be compared to individual and/or total confidence limits. The processing of a set of D-P wafers can continue, if one or more of the confidence limits are met, or corrective actions can be applied if one or more of the confidence limits are not met. Corrective actions can include establishing confidence values for one or more additional wafers in the set of D-P wafers, comparing the confidence values for one or more of the additional wafers to additional confidence limits; and either continuing to process the set of D-P wafers, if one or more of the additional confidence limits are met, or stopping the processing, if one or more of the additional confidence limits are not met.

In other examples, individual and/or total risk values for the D-P wafer can be compared to individual and/or total risk limits. The processing of a set of D-P wafers can continue, if one or more of the risk limits are met, or corrective actions can be applied if one or more of the risk limits are not met. Corrective actions can include establishing risk values for one or more additional wafers in the set of D-P wafers, comparing the risk values for one or more of the additional wafers to additional risk limits; and either continuing to process the set of D-P wafers, if one or more of the additional risk limits are met, or stopping the processing, if one or more of the additional risk limits are not met.

In other embodiments, a first set of D-P wafers can be sent from an external deposition system (not shown) to the transfer subsystem 170 and subsequently transferred to one or more of the subsystems (110, 120, 130, 140, 150, and 160). Alternatively, one or more of the wafers may be received by one or more other subsystems. One or more D-P sequences can be determined for the D-P wafers. In some cases, different D-P sequences can be determined for some of the D-P wafers. Alternatively, other processing sequences may be established. For example, pre-processing data can include data from the external deposition system and/or an external evaluation subsystem (not shown).

Figure 2:
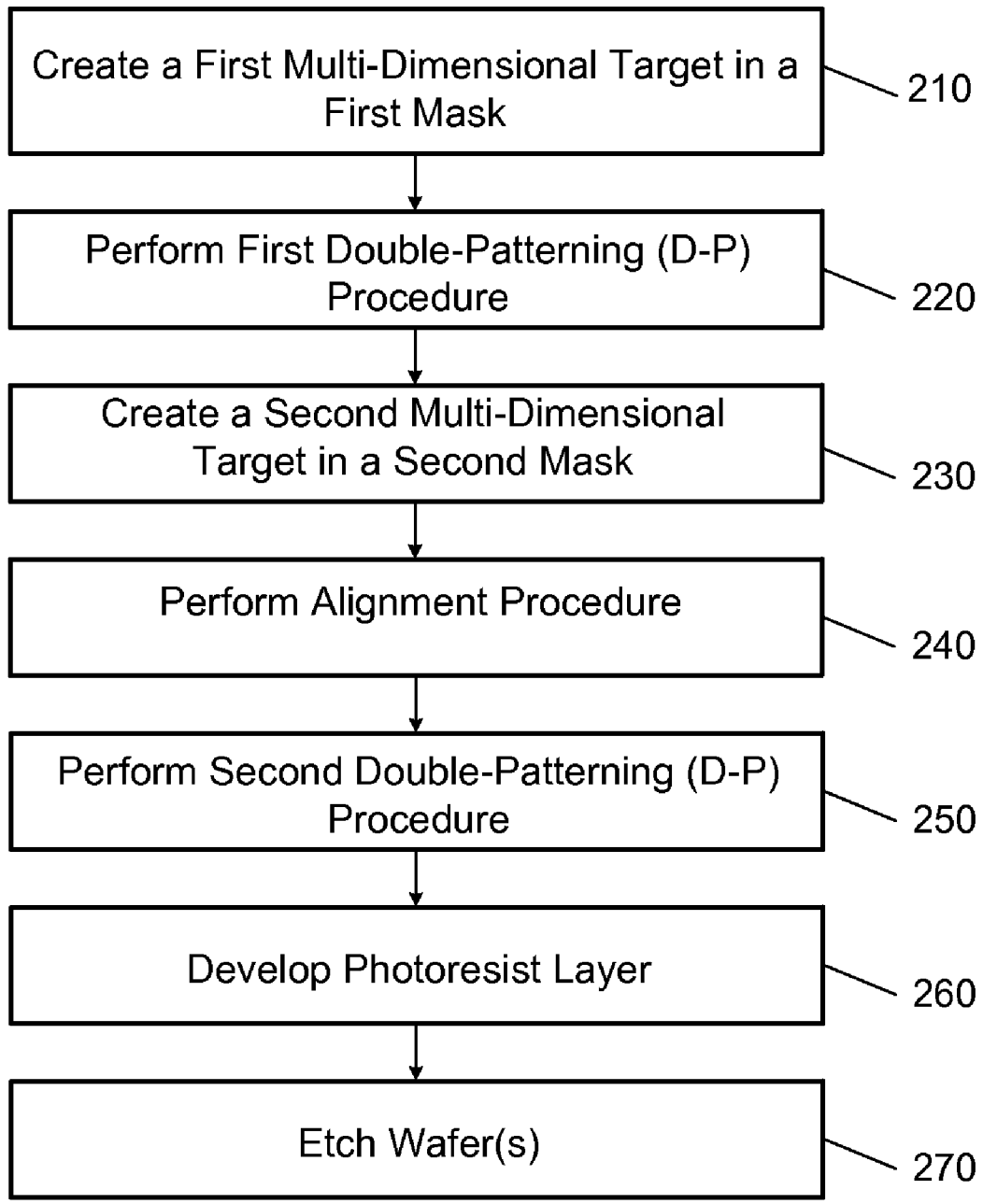
FIG. 2 shows an exemplary flow diagram of a procedure for processing a wafer in accordance with embodiments of the invention.

FIG. 2 shows an exemplary flow diagram of a procedure for processing a wafer in accordance with embodiments of the invention. In the illustrated embodiment, an exemplary procedure 200 is shown for using one or more multi-dimensional targets in one or more masks for aligning two different D-P patterns in one masking layer during wafer processing.

In 210, a first multi-dimensional target can be created in a first mask, and the first multi-dimensional target can include a plurality of first segmented lines, a plurality of second segmented lines perpendicular to the plurality of first segmented lines, and a plurality of third segmented lines parallel to the plurality of first segmented lines. For example, the first multi-dimensional target can be as shown in FIGS. 3a-3f. Alternatively, other configurations may be used. In addition, the first mask can include a first set of image features (first image pattern) for creating a first set of structures on a wafer.

When a first multi-dimensional target is created in a first mask, two or more first segmented lines can be created, each first segmented line can be aligned in a first direction and can have two or more first segments separated by a first separation distance. The two or more first segmented lines can be separated from each other by a first period, and each first segment can have a first length and a first width. Two or more second segmented lines can also be created in the first mask. Each second segmented line can be aligned in a second direction and can have two or more second segments separated by a second separation distance. The two or more second segmented lines can be separated from each other by a second period, and each second segment can have a second length and a second width. In addition, two or more third segmented lines can be created in the first mask. Each third segmented line can be aligned in the first direction and can have two or more third segments separated by a third separation distance. The two or more third segmented lines can be separated from each other by a third period, and each third segment can have a third length and a third width.

In 220, a first D-P procedure can be performed. In some cases, a portion of a photoresist layer can be exposed on a wafer using the first mask and a radiation source, and the first portion of the exposed photoresist layer can include one or more first target areas that can have a latent image of the first multi-dimensional target therein. Alternatively, target areas may not be required. In addition, the first portion of the exposed photoresist layer can include the latent images for the first set of structures on the wafer. Subsequently, the first mask can be used to establish other target areas and additional latent images over additional portions of the wafer. For example, step and repeat techniques can be performed by one or more scanner-related subsystems.

Figures 3A, 3B:
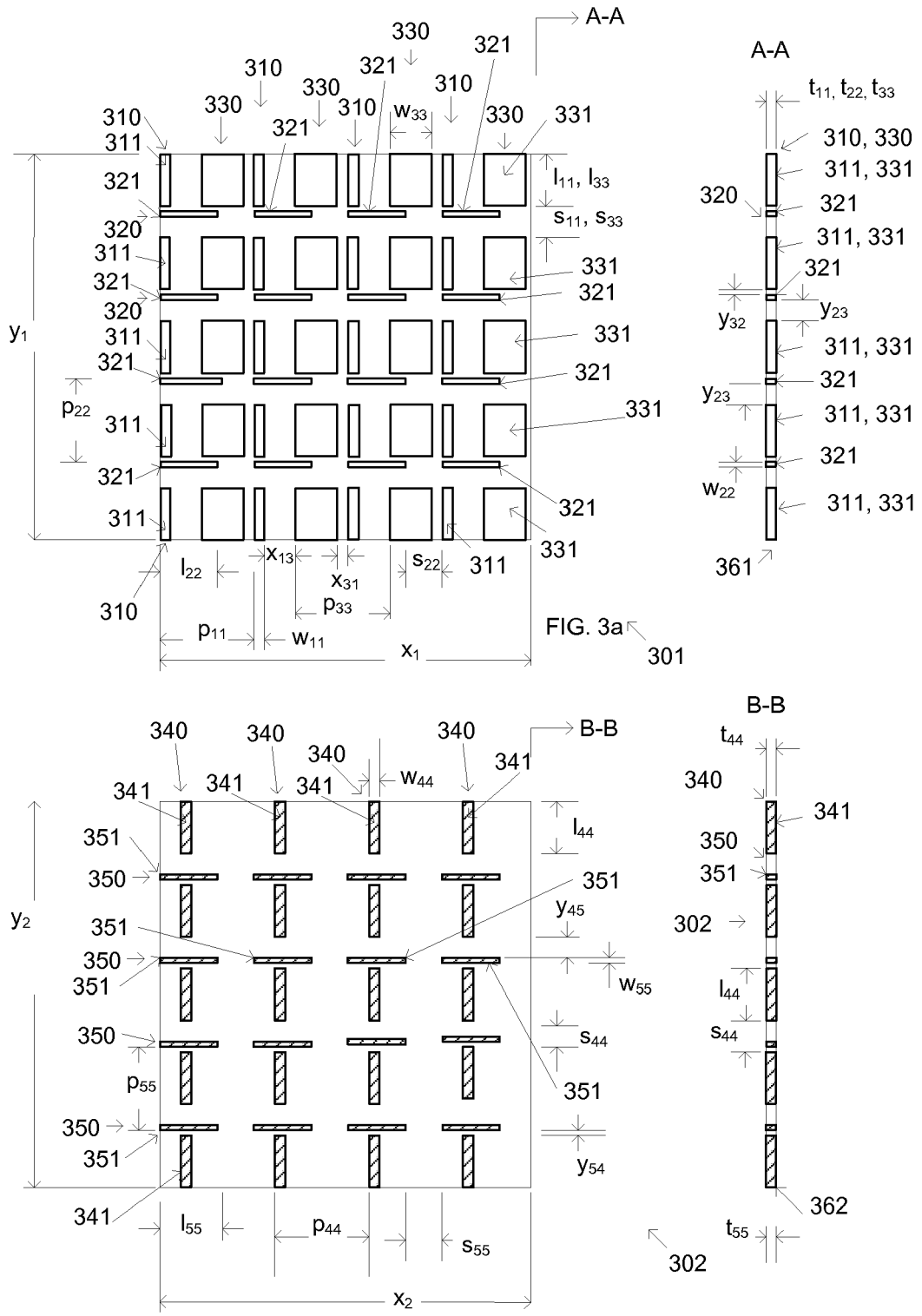
FIGS. 3a-3h show exemplary multi-dimensional targets and overlay arrangements in accordance with embodiments of the invention.

In 230, a second multi-dimensional target can be created in a second mask, and the second multi-dimensional target can include a plurality of fourth segmented lines, and a plurality of fifth segmented lines perpendicular to the plurality of fourth segmented lines. For example, the second multi-dimensional target can be as shown in FIG. 3b. Alternatively, other configurations may be used. In addition, the second mask can include a second set of image features (second image pattern) for creating a second set of structures on a wafer.

When a second multi-dimensional target is created in a second mask, two or more fourth segmented lines can be created. Each fourth segmented line can be aligned in a first direction and can have two or more fourth segments separated by a fourth separation distance. The two or more fourth segmented lines can be separated from each other by a fourth period, and each fourth segment can have a fourth length and a fourth width. In addition, two or more fifth segmented lines can be created. Each fifth segmented line can be aligned in a second direction and can have two or more fifth segments separated by a fifth separation distance. The two or more fifth segmented lines can be separated from each other by a fifth period, and each fifth segment can have a fifth length and a fifth width.

In 240, one or more alignment procedures can be performed. In some D-P processing sequences, the second mask can be aligned with the first portion of the first patterned layer using the first multi-dimensional target and second multi-dimensional target. For example, the alignment can take place in a scanner-related subsystem.

In some embodiments, one or more first alignment planes can be established in a first direction and one or more second alignment planes can be established in a second direction in the first multi-dimensional target, and one or more third alignment planes can be established in the first direction and one or more fourth alignment planes can be established in the second direction in the second multi-dimensional target. A first alignment offset limit can be established in the first direction, and a second alignment offset limit can be established in the second direction. A first alignment offset can be determined in the first direction using a first difference between the first alignment plane and the third alignment plane, and a second alignment offset can be determined in the second direction using a second difference between the second alignment plane and the fourth alignment plane. The alignment can be performed by minimizing a first difference between the first alignment offset and the first alignment offset limit, and minimizing a second difference between the second alignment offset and the second alignment offset limit. For example, the alignment planes can be as shown in FIGS. 3c-3f. Alternatively, other configurations may be used.

In other embodiments, a first x-axis alignment plane and a first y-axis alignment plane can be established in the first multi-dimensional target, and a second x-axis alignment plane and a second y-axis alignment plane can be established in the second multi-dimensional target. A first alignment offset limit can be established in the first direction, and a second alignment offset limit can be established in the second direction. A first alignment offset can be determined using a first difference between the first x-axis alignment plane and the second x-axis alignment plane, and a second alignment offset can be determined using a second difference between the first y-axis alignment plane and the second y-axis alignment plane. The alignment can be performed by minimizing a first difference between the first alignment offset and the first alignment offset limit, and minimizing a second difference between the second alignment offset and the second alignment offset limit. For example, the x-axis and y-axis alignment planes can be as shown in FIGS. 3c-3f. Alternatively, other configurations may be used.

In still other embodiments, a first alignment offset can be determined in the first direction using a first difference between one or more of the third segmented lines in the first multi-dimensional target and one or more of the fourth segmented lines in the second multi-dimensional target. For example, each element in the third segmented line can be wider than each element in the fourth segmented line. A second alignment offset can be determined in the second direction using a second difference between one or more of the third segmented lines in the first multi-dimensional target and one or more of the fifth segmented lines in the second multi-dimensional target. For example, each element in the third segmented line can be wider than each element in the fifth segmented line.

In addition, a refined first alignment offset can be established in the first direction using a second difference between one or more of the first segmented lines in the first multi-dimensional target and one or more of the fourth segmented lines in the second multi-dimensional target. A refined second alignment offset can be established in the second direction using a second difference between one or more of the second segmented lines in the first multi-dimensional target and one or more of the fifth segmented lines in the second multi-dimensional target. Then, the new first difference between the refined first alignment offset and the first alignment offset limit and the new second difference between the refined second alignment offset and the second alignment offset limit can be minimized.

In additional embodiments, a first alignment offset can be determined in the first direction using a first difference between one or more of the first segmented lines in the first multi-dimensional target and one or more of the fourth segmented lines in the second multi-dimensional target. For example, each element in the first segmented line being wider than each element in the fourth segmented line. A second alignment offset can be determined in the second direction using a second difference between one or more of the second segmented lines in the first multi-dimensional target and one or more of the fifth segmented lines in the second multi-dimensional target. For example, each element in the second segmented line being wider than each element in the second segmented line.

In 250, when a correct alignment procedure has been performed, a second D-P procedure can be performed. In some examples, a second portion of the photoresist layer can be exposed on a wafer using the second mask and a radiation source, and the second portion of the exposed photoresist layer can include one or more combined target areas that can have a latent image of the first and second multi-dimensional target therein, can include one or more first target areas that can have a latent image of only the first multi-dimensional target therein, and can include one or more second target areas that can have a latent image of only the second multi-dimensional target therein. Alternatively, target areas may not be required. In addition, the second portion of the exposed photoresist layer can include the latent images for the second set of structures on the wafer. Subsequently, the second mask can be used to establish other target areas and additional latent images over additional portions of the wafer. For example, step and repeat techniques can be performed by one or more scanner-related subsystems.

In 260, the exposed photoresist layer can be developed. For example, one or more of a first set of D-P wafers can be transferred to one or more of the lithography subsystems 110, and one or more of the processing elements 112 can be used to develop the exposed photoresist layer. One or more of the processing elements 112 can be used for thermal processing (baking), and one or more of the evaluation elements 115 can be used to measure and/or inspect one or more of the developed photoresist layers.

In 270, the developed photoresist layer can be used in one or more etching processes. For example, one or more of a first set of D-P wafers can be transferred to one or more of the etch subsystems 130, and one or more of the processing elements 132 can be used to perform one or more etching processes using the developed photoresist layer as a masking layer. One or more of the processing elements 132 can be used for cleaning or trimming, and one or more of the evaluation elements 135 can be used to measure and/or inspect one or more of the etched layers.

FIGS. 3a-3f show exemplary multi-dimensional targets and overlay arrangements in accordance with embodiments of the invention. FIGS. 3a and 3b illustrate exemplary overlay targets in accordance with embodiments of the invention. A first target pattern 301 in a segmented multi-dimensional target is illustrated in FIG. 3a, and the second target pattern 302 in the segmented multi-dimensional target is illustrated in FIG. 3b. For example, the first target pattern 301 can be used as a mask for producing a first set of structures using a first D-P processing sequence and the second target pattern 302 can be used as mask for producing a second set of structures using a second D-P processing sequence.

The target dimensions $(x_1, y_1)$ and $(x_2, y_2)$ shown in FIGS. 3a-3f can vary from approximately 40 um (micron) to approximately 60 um. Square targets are illustrated, but other shapes can be used. In addition, a limited number of repeating structures are illustrated, but this is not required for the invention. The number of repeating structures can vary from less than 20 to more than 100.

The first target pattern 301 can comprise one or more first segmented lines 310 that can be positioned at one or more locations in the first target pattern 301. Four first segmented lines 310 are shown for illustrative purposes, and this is not required for the invention. The first segmented lines 310 can be periodic in the x-direction and can be separated by a first period $p_{11}$ in the x-direction. Each first segmented line 310 can have two or more first elements 311 separated by first spaces $s_{11}$ and each first element 311 can have a first length $l_{11}$ and a first width $w_{11}$. Five first elements 311 are shown for illustrative purposes, and this is not required for the invention. Alternatively, non-periodic lines may be used, the number of first elements and/or spaces may be different, the length of the first elements and/or spaces may be different, and the first elements may have different thicknesses.

In some embodiments, the first length $l_{11}$ can range from approximately 50 nm to approximately 500 nm, the second length $l_{22}$ can range from approximately 50 nm to approximately 500 nm, the third length $l_{33}$ can range from approximately 50 nm to approximately 500 nm, the fourth length $l_{44}$ can range from approximately 50 nm to approximately 500 nm, and the fifth length $l_{55}$ can range from approximately 50 nm to approximately 500 nm. In addition, the first width $w_{11}$ can range from approximately 50 nm to approximately 500 nm, the second width $w_{22}$ can range from approximately 50 nm to approximately 500 nm, the third width $w_{33}$ can range from approximately 50 nm to approximately 500 nm, the fourth width $w_{44}$ can range from approximately 50 nm to approximately 500 nm, and the fifth width $w_{55}$ can range from approximately 50 nm to approximately 500 nm.

The first target pattern 301 can also comprise one or more second segmented lines 320 that can be positioned at one or more locations in the first target pattern 301. Four second segmented lines 320 are shown for illustrative purposes, and this is not required for the invention. The second segmented lines 320 can be periodic in the x-direction and can be separated by a second period $p_{22}$ in the x-direction. Each second segmented line 320 can have two or more second elements 321 separated by second spaces $s_{22}$ and each second element 321 can have a second length $l_{22}$ and a second width $w_{22}$. Five second elements 321 are shown for illustrative purposes, and this is not required for the invention. Alternatively, non-periodic lines may be used, the number of second elements and/or spaces may be different, the length of the second elements and/or spaces may be different, and the second elements may have different thicknesses.

The first target pattern 301 can also comprise one or more third segmented lines 330 that can be positioned at one or more locations in the first target pattern 301. Four third segmented lines 330 are shown for illustrative purposes, and this is not required for the invention. The third segmented lines 330 can be periodic in the x-direction and can be separated by a third period $p_{33}$ in the x-direction. Each third segmented line 330 can have two or more third elements 331 separated by third spaces $s_{33}$ and each third element 331 can have a third length $l_{33}$ and a third width $w_{33}$. Five third elements 331 are shown for illustrative purposes, and this is not required for the invention. Alternatively, non-periodic lines may be used, the number of third elements and/or spaces may be different, the length of the third elements and/or spaces may be different, and the third elements may have different thicknesses.

The second target pattern 302 can comprise one or more fourth segmented lines 340 that can be positioned at one or more locations in the second target pattern 302. Four fourth segmented lines 340 are shown for illustrative purposes, and this is not required for the invention. The fourth segmented lines 340 can be periodic in the y-direction and can be separated by a fourth period $p_{44}$ in the y-direction. Each fourth segmented line 340 can have two or more fourth elements 341 separated by fourth spaces $s_{44}$ and each fourth element 341 can have a fourth length $l_{44}$ and a fourth width $w_{44}$. Five fourth elements 341 are shown for illustrative purposes, and this is not required for the invention. Alternatively, non-periodic lines may be used, the number of fourth elements and/or spaces may be different, the length of the fourth elements and/or spaces may be different, and the fourth elements may have different thicknesses.

The second target pattern 302 can also comprise one or more fifth segmented lines 350 that can be positioned at one or more locations in the second target pattern 302. Four fifth segmented lines 350 are shown for illustrative purposes, and this is not required for the invention. The fifth segmented lines 350 can be periodic in the y-direction and can be separated by a fifth period $p_{55}$ in the y-direction. Each fifth segmented line 350 can have two or more fifth elements 351 separated by fifth spaces $s_{55}$ and each fifth element 351 can have a fifth length $l_{55}$ and a fifth width $w_{55}$. Five fifth elements 351 are shown for illustrative purposes, and this is not required for the invention. Alternatively, non-periodic lines may be used, the number of fifth elements and/or spaces may be different, the length of the fifth elements and/or spaces may be different, and the fifth elements may have different thicknesses.

In some embodiments, the first period $p_{11}$ can range from approximately 50 nm to approximately 500 nm, the second period $p_{22}$ can range from approximately 50 nm to approximately 500 nm, the third period $p_{33}$ can range from approximately 50 nm to approximately 500 nm, the fourth period $p_{44}$ can range from approximately 50 nm to approximately 500 nm, and the fifth period $p_{55}$ can range from approximately 50 nm to approximately 500 nm. In addition, the first separation $s_{11}$ can range from approximately 50 nm to approximately 500 nm, the second separation $s_{22}$ can range from approximately 50 nm to approximately 500 nm, the third separation $s_{33}$ can range from approximately 50 nm to approximately 500 nm, the fourth separation $s_{44}$ can range from approximately 50 nm to approximately 500 nm, and the fifth separation $s_{55}$ can range from approximately 50 nm to approximately 500 nm.

The first target pattern 300 can include a first masking layer 301 having a first thickness $t_{11}$; the second masking layer 302 can have a second thickness $t_{22}$. The first thickness $t_{11}$ can range from approximately 0.5 um to approximately 50 um, and the second thickness $t_{22}$ can range from approximately 0.5 um to approximately 50 um.

As additionally shown in FIG. 3a, the first segmented lines 310 can be aligned with the third segmented lines 330 in the first target pattern 301. In various embodiments, the first x-axis separation distance $x_{13}$ between the first segmented lines 310 and the third segmented lines 330 can range from approximately 25 nm to approximately 250 nm, and the second x-axis separation distance $x_{31}$ between the first segmented lines 310 and the third segmented lines 330 can range from approximately 25 nm to approximately 250 nm. The first y-axis separation distance $y_{23}$ between the second segmented lines 320 and the third segmented lines 330 can range from approximately 50 nm to approximately 500 nm, and the, the second y-axis separation distance $y_{32}$ between the third segmented lines 330 and the second segmented lines 320 can range from approximately 50 nm to approximately 500 nm.

As additionally shown in FIG. 3b, the fourth segmented elements 341 can be aligned in the x-direction, and the fifth segmented elements 351 can be aligned in the y-direction. The first y-axis separation distance $y_{45}$ between the fourth segmented lines 340 and the fifth segmented lines 350 can range from approximately 25 nm to approximately 250 nm, and the second y-axis separation distance $y_{54}$ between the fifth segmented lines 350 and the fourth segmented lines 340 can range from approximately 25 nm to approximately 250 nm.

Figure 3C:
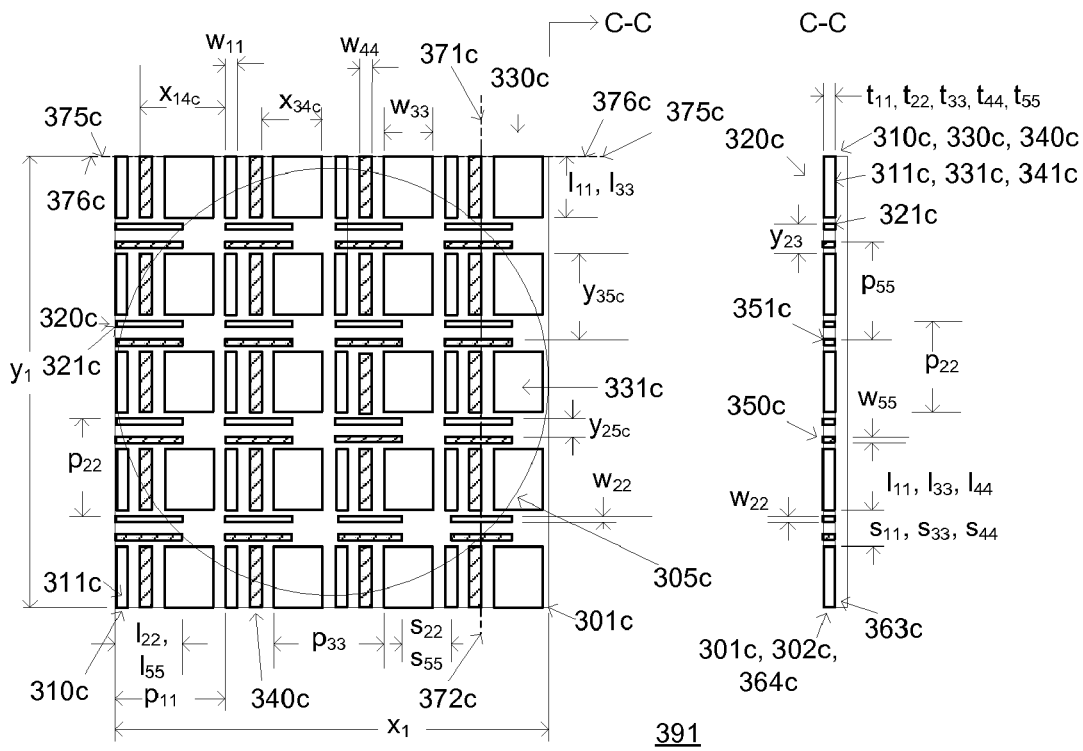
Figure 3D:
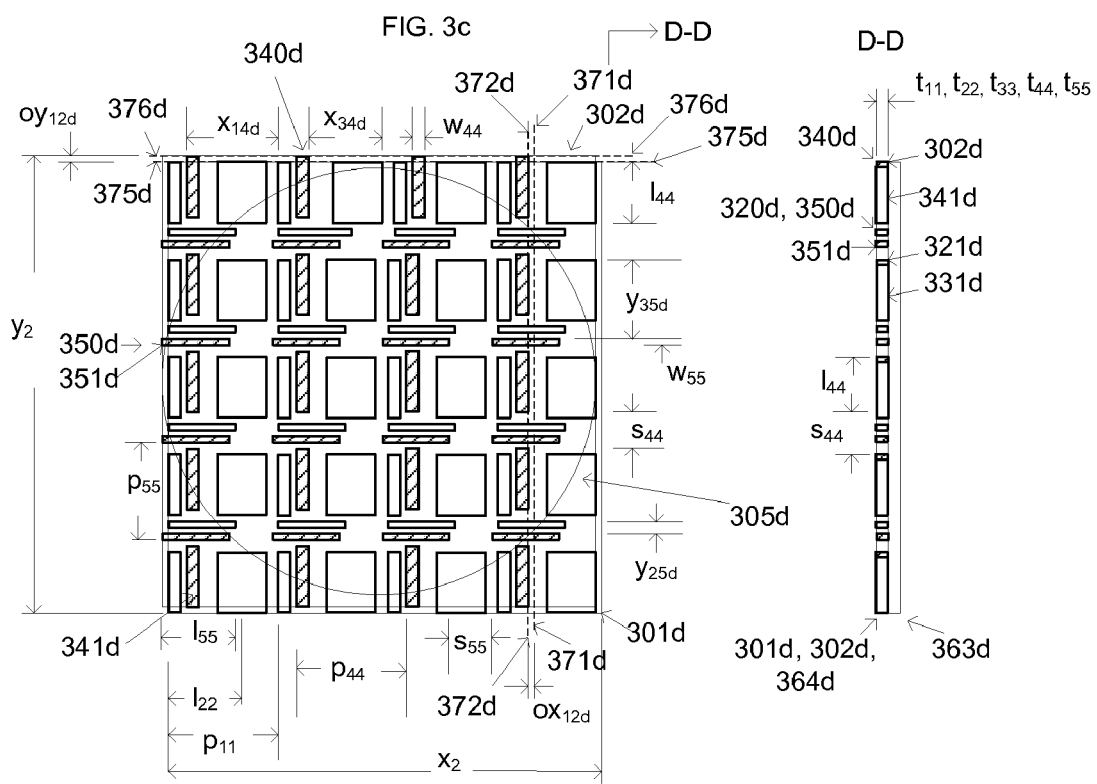

FIGS. 3c and 3d illustrate exemplary overlay arrangements in accordance with embodiments of the invention. A first overlay arrangement 391 is illustrated in FIG. 3c, and a second overlay arrangement 392 is illustrated in FIG. 3d. For example, the first overlay arrangement 391 can be used to show an aligned state, and the second overlay arrangement 392 can be used to show a non-aligned state. Exemplary spot sizes 305c and 305d are also shown.

The first overlay arrangement 391 can include the first target pattern 301c (FIG. 3a) and a second target pattern 302c (FIG. 3b) in a combined target layer 364c and the combined target layer 364c can be on one or more substrate layers 363c.

When the first target pattern 301c and the second target pattern 302c are aligned in a first direction as shown in FIG. 3c, the first x-alignment plane 371c in the first target pattern 301c can be aligned with the second x-alignment plane 372c in the second target pattern 302c. When the first target pattern 301c and the second target pattern 302c are aligned in a second direction as shown in FIG. 3c, the first y-alignment plane 375c in the first target pattern 301c can be aligned with the second y-alignment plane 376c in the second target pattern 302c.

When the first target pattern 301c and a second target pattern 302c are aligned as shown in FIG. 3c, the fourth segmented lines 340c in the second target pattern 302c can be aligned in the y-direction with the first segmented lines 310c and the third segmented lines 330c in the first target pattern 301c.

The second overlay arrangement 392 can include the first target pattern 301d and an offset second target pattern 302d in combined target layer 364d and the combined target layer 364d can be on one or more substrate layers 363d.

When the first target pattern 301d and an offset second target pattern 302d are not aligned as shown in FIG. 3d, the first x-alignment plane 371d in the first target pattern 301d can be offset by a first x-axis value $(ox_{12d})$ in the x-direction from offset second x-alignment plane 372d in the offset second target pattern 302d. In some examples, the first x-axis offset value $(ox_{12d})$ in the x-direction can range from a negative value to a positive value, and the first x-axis offset value $(ox_{12d})$ can range from approximately −500 nm to approximately +500 nm. In other examples, the first x-axis offset value ($ox_{12d}$) can range from approximately −100 nm to approximately +100 nm. In alternate embodiments, the first x-axis offset value ($ox_{12d}$) may be dependent upon the first period $p_{11}$, the second period $p_{22}$, the third period $p_{33}$, the fourth period $p_{44}$, or the fifth period $p_{55}$, or any combination thereof. In other examples, the first x-axis offset value ($ox_{12d}$) can range from approximately −100 nm to approximately +100 nm. In other alternate embodiments, the first x-axis offset value ($ox_{12d}$) may be dependent upon the first width $w_{11}$, the second width $w_{22}$, the third width $w_{33}$, the fourth width $w_{44}$, or the fifth width $w_{55}$, or any combination thereof.

When the first target pattern 301$d$ and an offset second target pattern 302$d$ are not aligned as shown in FIG. 3$d$, the first y-alignment plane 375$d$ in the first target pattern 301$d$ can be offset by a first y-axis value ($oy_{12d}$) in the y-direction from the offset second y-alignment plane 376$d$ in the offset second target pattern 302$d$. In some examples, the first y-axis offset value ($oy_{12d}$) in the y-direction can range from a negative value to a positive value, and the first y-axis offset value ($oy_{12d}$) can range from approximately −500 nm to approximately +500 nm. In other examples, the first y-axis offset value ($oy_{12d}$) can range from approximately −100 nm to approximately +100 nm. In alternate embodiments, the first y-axis offset value ($oy_{12d}$) may be dependent upon the first period $p_{11}$, the second period $p_{22}$, the third period $p_{33}$, the fourth period $p_{44}$, or the fifth period $p_{55}$, or any combination thereof. In other examples, the first y-axis offset value ($oy_{12d}$) can range from approximately −100 nm to approximately +100 nm. In other alternate embodiments, the first y-axis offset value ($oy_{12d}$) may be dependent upon the first width $w_{11}$, the second width $w_{22}$, the third width $w_{33}$, the fourth width $w_{44}$, or the fifth width $w_{55}$, or any combination thereof.

In some embodiments, the first x-alignment plane 371$d$ in the first target pattern 301$d$ can be substantially parallel to the y-axis, and the offset second x-alignment plane 372$d$ in the offset second target pattern 302$d$ can also be substantially parallel to the y-axis. Alternatively, the first x-alignment plane 371$d$ in the first target pattern 301$d$ may not be substantially parallel to the y-axis, and the offset second x-alignment plane 372$d$ in the offset second target pattern 302$d$ may also not be substantially parallel to the y-axis. In addition, the first y-alignment plane 375$d$ in the first target pattern 301$d$ can be substantially parallel to the x-axis, and the offset second y-alignment plane 376$d$ in the offset second target pattern 302$d$ can also be substantially parallel to the x-axis. Alternatively, the first y-alignment plane 375$d$ in the first target pattern 301$d$ may not be substantially parallel to the x-axis, and the offset second y-alignment plane 376$d$ in the offset second target pattern 302$d$ may also not be substantially parallel to the x-axis.

As shown in FIG. 3$c$, when the first overlay arrangement 391 is in an "aligned state", there can be a first x-axis separation distance $x_{14c}$ between the first segmented lines 310$c$ in the first target pattern 301$c$ in the first target layer 361$c$ and the fourth segmented lines 340$c$ in the second target layer 362$c$ and the first x-axis separation distance $x_{14c}$ can be used to calculate the overlay error in the x-direction. The first x-axis separation distance $x_{14c}$ can range from a negative value to a positive value, and the first elements 311$c$ in the first target pattern 301$c$ in the first target layer 361$c$ can be aligned with the fourth elements 341$c$ in the second target pattern 302$c$ in the second target layer 362$c$ in the y-direction. Alternatively, the first elements 311$c$ in the first target pattern 301$c$ in the first target layer 361$c$ may not be aligned with the fourth elements 341$c$ in the second target layer 362$c$.

As shown in FIG. 3$d$, when the second overlay arrangement 392 is in an "non-aligned state", there can be a first offset x-axis separation distance $x_{14d}$ between the first segmented lines 310$d$ in the first target pattern 301$d$ in the first target layer 361$d$ and the offset fourth segmented lines 340$d$ in the offset second target pattern 302$d$ in the second target layer 362$d$ and the first offset x-axis separation distance $x_{14d}$ can be used to calculate the overlay error in the x-direction. The first offset x-axis separation distance $x_{14d}$ can range from a negative value to a positive value, and the first elements 311$d$ in the first target pattern 301$d$ in the first target layer 361$d$ can be aligned with the offset fourth elements 341$d$ in the offset second target pattern 302$d$ in the offset second target layer 362$d$ in the y-direction. Alternatively, the first elements 311$d$ in the first target pattern 301$d$ may not be aligned with the offset fourth elements 341$d$ in the offset second target pattern 302$d$.

As shown in FIG. 3$c$, when the first overlay arrangement 391 is in an "aligned state", there can be a second x-axis separation distance $x_{34c}$ between the third segmented lines 330$c$ in the first target pattern 301$c$ in the first target layer 361$c$ and the fourth segmented lines 340$c$ in the second target pattern 302$c$ in the second target layer 362$c$ and the second x-axis separation distance $x_{34c}$ can also be used to calculate the overlay error in the x-direction. The second x-axis separation distance $x_{34c}$ can range from a negative value to a positive value, and the third elements 331$c$ in the first target pattern 301$c$ in the first target layer 361$c$ can be aligned with the fourth elements 341$c$ in the second target pattern 302$c$ in the second target layer 362$c$ in the y-direction. Alternatively, the third elements 331$c$ in the first target layer 361$c$ may not be aligned with the fourth elements 341$c$ in the second target layer 362$c$.

As shown in FIG. 3$d$, when the second overlay arrangement 392 is in an "non-aligned state", there can be a different second x-axis separation distance $x_{34d}$ between the third segmented lines 330$d$ in the first target pattern 301$d$ in the first target layer 361$d$ and the offset fourth segmented lines 340$d$ in the offset second target pattern 302$d$ in the offset second target layer 362$d$ and the second x-axis separation distance $x_{34d}$ can be used to calculate the overlay error in the x-direction. The different second x-axis separation distance $x_{34d}$ can range from a negative value to a positive value, and the third elements 331$d$ in the first target layer 361$d$ can be aligned with the offset fourth elements 341$d$ in the offset second target layer 362$d$ in the y-direction. Alternatively, the third elements 331$d$ in the first target layer 361$d$ may not be aligned with the offset fourth elements 341$d$ in the offset second target layer 362$d$.

As shown in FIG. 3$c$, when the first overlay arrangement 391 is in an "aligned state", the first x-axis separation distance $x_{14c}$ can be equal to a first x-alignment limit, and the second x-axis separation distance $x_{34c}$ can be equal to a second x-alignment limit. As shown in FIG. 3$d$, when the second overlay arrangement 392 is in a "non-aligned state", the first offset x-axis separation distance $x_{14d}$ may not be equal to the first x-alignment limit, and the second offset x-axis separation distance $x_{34d}$ may not be equal to a second x-alignment limit. When the first target pattern 301$d$ and an offset second target pattern 302$d$ are not aligned as shown in FIG. 3$d$, the overlay error data can be determined using the difference between the first x-axis separation distance $x_{14c}$ and the first offset x-axis separation distance $x_{14d}$. In addition, overlay error data can be determined using the difference between the second x-axis separation distance $x_{34c}$ and the second offset x-axis separation distance $x_{34d}$.

As additionally shown in the first overlay arrangement 391, there can be a first y-axis separation distance $y_{25c}$ between the second segmented lines 320$c$ in the first target layer 361$c$ and the fifth segmented lines 350c in the second target layer 362c and the first y-axis separation distance $y_{25c}$ can be used to calculate the overlay error in the y-direction. The first y-axis separation distance $y_{25c}$ can range from a negative value to a positive value, and the second elements 321c in the first target layer 361c can be aligned with the fifth elements 351c in the second target layer 362c in the x-direction. Alternatively, the second elements 321c in the first target layer 361c may not be aligned with the fifth elements 351c in the second target layer 362c.

Referring to the second overlay arrangement 392, there can be a first offset y-axis separation distance $y_{25d}$ between the second segmented lines 320d in the first target layer 361d and the offset fifth segmented lines 350d in the offset second target layer 362d and the first offset y-axis separation distance $y_{25d}$ can be used to calculate the overlay error in the y-direction. The first offset y-axis separation distance $y_{25d}$ can range from a negative value to a positive value, and the second elements 321d in the first target layer 361d can be aligned with the offset fifth elements 351d in the offset second target layer 362d in the x-direction. Alternatively, the second elements 321d in the first target layer 361d may not be aligned with the offset fifth elements 351d in the offset second target layer 362d.

As additionally shown in the first overlay arrangement 391, there can be a second y-axis separation distance $y_{35c}$ between the third segmented lines 330c in the first target layer 361c and the fifth segmented lines 350c in the second target layer 362c and the second y-axis separation distance $y_{35c}$ can also be used to calculate the overlay error in the y-direction. The second x-axis separation distance $y_{35c}$ can range from a negative value to a positive value, and the third elements 331 in the first target layer 361c can be aligned with the fifth elements 351c in the second target layer 362c in the y-direction. Alternatively, the third elements 331c in the first target layer 361c may not be aligned with the fifth elements 351c in the second target layer 362c.

Referring to the second overlay arrangement 392, there can be a second offset y-axis separation distance $y_{35d}$ between the third segmented lines 330d in the first target layer 361d and the offset fifth segmented lines 350d in the offset second target layer 362d and the second offset y-axis separation distance $y_{35d}$ can be used to calculate the overlay error in the y-direction. The second offset y-axis separation distance $y_{35d}$ can range from a negative value to a positive value, and the third elements 331d in the first target layer 361d can be aligned with the offset fifth elements 351d in the offset second target pattern 302d in the offset second target layer 362d in the x-direction. Alternatively, the third elements 331d in the first target layer 361d may not be aligned with the offset fifth elements 351d in the offset second target layer 362d.

As shown in FIG. 3c, when the first overlay arrangement 391 is in an "aligned state", the first y-axis separation distance $y_{25c}$ can be equal to a first y-alignment limit, and the second y-axis separation distance $y_{35c}$ can be equal to a second y-alignment limit. As shown in FIG. 3d, when the second overlay arrangement 392 is in a "non-aligned state", the first offset y-axis separation distance $y_{25d}$ may not be equal to the first y-alignment limit, and the second offset y-axis separation distance $y_{35d}$ may not be equal to the second y-alignment limit. When the first target pattern 301d and an offset second target pattern 302d are not aligned as shown in FIG. 3d, the overlay error data can be determined using the difference between the first y-axis separation distance $y_{25c}$ and the first offset y-axis separation distance $y_{25d}$. In addition, overlay error data can be determined using the difference between the second y-axis separation distance $y_{35c}$ and the second offset y-axis separation distance $y_{35d}$.

Figure 3E:
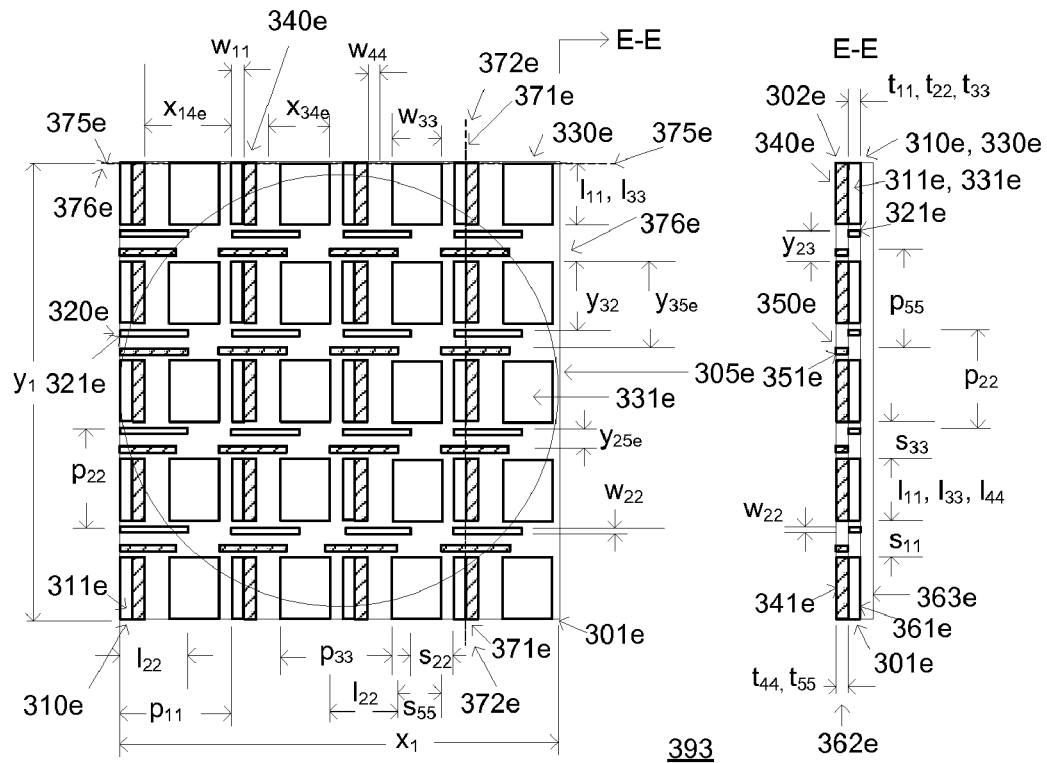
Figure 3F:
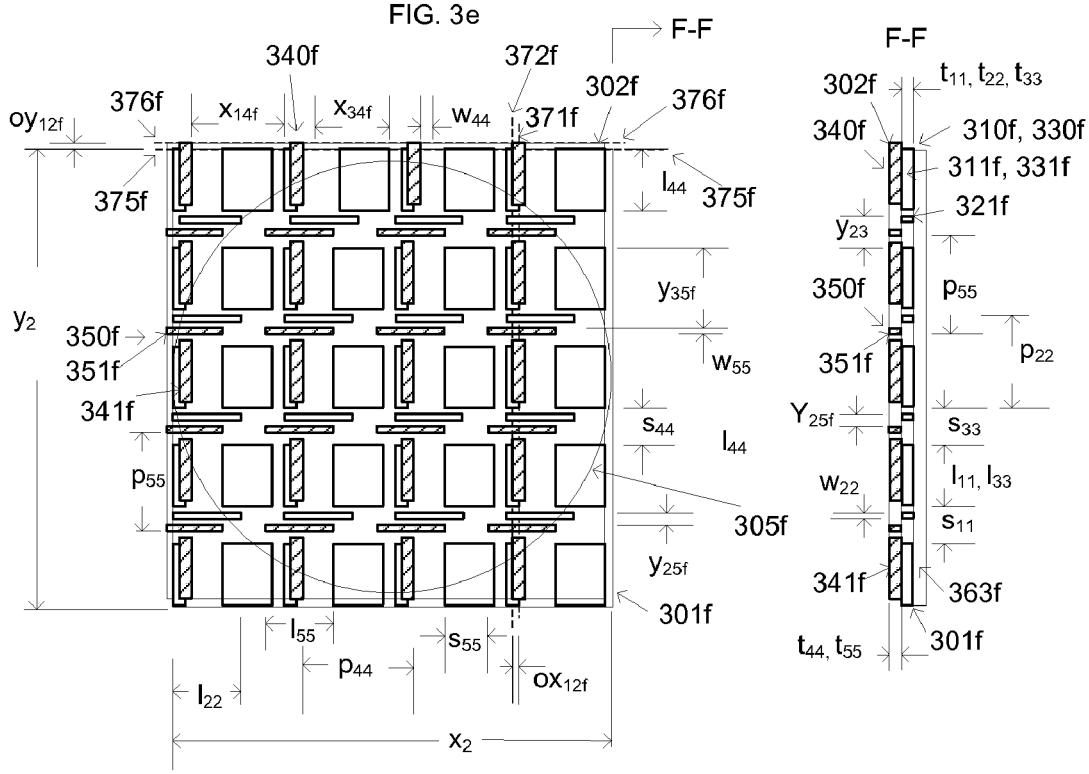

FIGS. 3e and 3f illustrate additional exemplary overlay arrangements in accordance with embodiments of the invention. A third overlay arrangement 393 is illustrated in FIG. 3e, and a fourth overlay arrangement 394 is illustrated in FIG. 3f. For example, third overlay arrangement 393 can be used to show an aligned state, the fourth overlay arrangement 394 can be used to show a non-aligned state, and like dimensions and elements can be illustrated by the same or similar reference numbers. Exemplary spot sizes 305e and 305f are also shown.

A first target pattern 301e is illustrated in a first target layer 361e, a second target pattern 302e is illustrated in a target second layer 362e, and a substrate layer 363e is shown. For example, the first target pattern 301e can be created in a masking layer for producing a first set of structures using a first D-P processing sequence and the second target pattern 302e can be used as mask for producing a second set of structures using a second D-P processing sequence.

When the first target pattern 301e and a second target pattern 302e are aligned in a first direction as shown in FIG. 3e, the first x-alignment plane 371e in the first target pattern 301e can be aligned with the second x-alignment plane 372e in the second target pattern 302e. When the first target pattern 301e and a second target pattern 302e are aligned in a second direction as shown in FIG. 3e, the first y-alignment plane 375e in the first target pattern 301e can be aligned with the second y-alignment plane 376e in the second target pattern 302e.

When the first target pattern 301e and a second target pattern 302e are aligned as shown in FIG. 3e, the fourth segmented lines 340e in the second target pattern 302e can be aligned in the y-direction with the first segmented lines 310e and the third segmented lines 330e in the first target pattern 301e.

The fourth overlay arrangement 394 can include a first target pattern 301f, an offset second target pattern 302f, and a substrate layer 363f. For example, the first target pattern 301f can be created in a masking layer for producing a first set of structures using a first D-P processing sequence and the offset second target pattern 302f can be used as mask for producing a second set of structures using a second D-P processing sequence after the alignment error is corrected.

When the first target pattern 301f and an offset second target pattern 302f are not aligned as shown in FIG. 3f, the first x-alignment plane 371f in the first target pattern 301f can be offset by a first x-axis value $(ox_{12f})$ in the x-direction from second x-alignment plane 372f in the offset second target pattern 302f. In some examples, the first x-axis offset value $(ox_{12f})$ in the x-direction can range from a negative value to a positive value, and the first x-axis offset value $(ox_{12f})$ can range from approximately −500 nm to approximately +500 nm. In other examples, the first x-axis offset value $(ox_{12f})$ can range from approximately −100 nm to approximately +100 nm. In alternate embodiments, the first x-axis offset value $(ox_{12f})$ may be dependent upon the first period $p_{11}$, the second period $p_{22}$, the third period $p_{33}$, the fourth period $p_{44}$, or the fifth period $p_{55}$, or any combination thereof. In other examples, the first x-axis offset value $(ox_{12f})$ can range from approximately −100 nm to approximately +100 nm. In other alternate embodiments, the first x-axis offset value $(ox_{12f})$ may be dependent upon the first width $w_{11}$, the second width $w_{22}$, the third width $w_{33}$, the fourth width $w_{44}$, or the fifth width $w_{55}$, or any combination thereof.

When the first target pattern 301f and an offset second target pattern 302f are not aligned as shown in FIG. 3f, the first y-alignment plane 375f in the first target pattern 301f can be offset by a first y-axis value ($oy_{12f}$) in the y-direction from the offset second y-alignment plane 376$f$ in the offset second target pattern 302$f$. In some examples, the first y-axis offset value ($oy_{12f}$) in the y-direction can range from a negative value to a positive value, and the first y-axis offset value ($oy_{12f}$) can range from approximately −500 nm to approximately +500 nm. In other examples, the first y-axis offset value ($oy_{12f}$) can range from approximately −100 nm to approximately +100 nm. In alternate embodiments, the first y-axis offset value ($oy_{12f}$) may be dependent upon the first period $p_{11}$, the second period $p_{22}$, the third period $p_{33}$, the fourth period $p_{44}$, or the fifth period $p_{55}$, or any combination thereof. In other examples, the first y-axis offset value ($oy_{12f}$) can range from approximately −100 nm to approximately +100 nm. In other alternate embodiments, the first y-axis offset value ($oy_{12f}$) may be dependent upon the first width $w_{11}$, the second width $w_{22}$, the third width $w_{33}$, the fourth width $w_{44}$, or the fifth width $w_{55}$, or any combination thereof.

In some embodiments, the first x-alignment plane 371$f$ in the first target pattern 301$f$ can be substantially parallel to the y-axis, and the offset second x-alignment plane 372$f$ in the offset second target pattern 302$f$ can also be substantially parallel to the y-axis. Alternatively, the first x-alignment plane 371$f$ in the first target pattern 301$f$ may not be substantially parallel to the y-axis, and the offset second x-alignment plane 372$f$ in the offset second target pattern 302$f$ may also not be substantially parallel to the y-axis. In addition, the first y-alignment plane 375$f$ in the first target pattern 301$f$ can be substantially parallel to the x-axis, and the offset second y-alignment plane 376$f$ in the offset second target pattern 302$f$ can also be substantially parallel to the x-axis. Alternatively, the first y-alignment plane 375$f$ in the first target pattern 301$f$ may not be substantially parallel to the x-axis, and the offset second y-alignment plane 376$f$ in the offset second target pattern 302$f$ may also not be substantially parallel to the x-axis.

As shown in FIG. 3$e$, when the third overlay arrangement 393 is in an "aligned state", there can be a first x-axis separation distance $x_{14e}$ between the first segmented lines 310$e$ in the first target layer 361$e$ and the fourth segmented lines 340$e$ in the second target layer 362$e$ and the first x-axis separation distance $x_{14e}$ can be used to calculate the overlay error in the x-direction. The first x-axis separation distance $x_{14e}$ can range from a negative value to a positive value, and the first elements 311$e$ in the first target layer 361$e$ can be aligned with the fourth elements 341$e$ in the second target layer 362$e$ in the y-direction. Alternatively, the first elements 311$e$ in the first target layer 361$e$ may not be aligned with the fourth elements 341$e$ in the second target layer 362$e$.

As shown in FIG. 3$f$, the fourth overlay arrangement 394 shows another "non-aligned state", there can be a first offset x-axis separation distance $x_{14f}$ between the first segmented lines 310$f$ in the first target layer 361$f$ and the offset fourth segmented lines 340$f$ in the offset second target layer 362$f$ and the first offset x-axis separation distance $x_{14f}$ can be used to calculate the overlay error in the x-direction. The first offset x-axis separation distance $x_{14f}$ can range from a negative value to a positive value, and the first elements 311$f$ in the first target layer 361$f$ can be aligned with the offset fourth elements 341$f$ in the offset second target layer 362$f$ in the y-direction. Alternatively, the first elements 311$f$ in the first target layer 361$f$ may not be aligned with the offset fourth elements 341$f$ in the offset second target layer 362$f$.

As shown in FIG. 3$e$, when the third overlay arrangement 393 is in an "aligned state", there can be a second x-axis separation distance $x_{34e}$ between the third segmented lines 330$e$ in the first target layer 361$e$ and the fourth segmented lines 340$e$ in the second target layer 362$e$ and the second x-axis separation distance $x_{34e}$ can also be used to calculate the overlay error in the x-direction. The second x-axis separation distance $x_{34e}$ can range from a negative value to a positive value, and the third elements 331$e$ in the first target layer 361$e$ can be aligned with the fourth elements 341$e$ in the second target layer 362$e$ in the y-direction. Alternatively, the third elements 331$e$ in the first target layer 361$e$ may not be aligned with the fourth elements 341$e$ in the second target layer 362$e$.

As shown in FIG. 3$f$, when the fourth overlay arrangement 394 is in an "non-aligned state", there can be a different second x-axis separation distance $x_{34f}$ between the third segmented lines 330$f$ in the first target layer 361$f$ and the offset fourth segmented lines 340$f$ in the offset second target layer 362$f$ and the second x-axis separation distance $x_{34f}$ can be used to calculate the overlay error in the x-direction. The second offset x-axis separation distance $x_{34f}$ can range from a negative value to a positive value, and the third elements 331$f$ in the first target layer 361$f$ can be aligned with the offset fourth elements 341$f$ in the offset second target layer 362$f$ in the y-direction. Alternatively, the third elements 331$f$ in the first target layer 361$f$ may not be aligned with the offset fourth elements 341$f$ in the offset second target layer 362$f$.

As shown in FIG. 3$e$, when the third overlay arrangement 393 is in an "aligned state", the first x-axis separation distance $x_{14e}$ can be equal to a first x-alignment limit, and the second x-axis separation distance $x_{34e}$ can be equal to a second x-alignment limit. As shown in FIG. 3$f$, when the fourth overlay arrangement 394 is in a "non-aligned state", the first offset x-axis separation distance $x_{14f}$ may not be equal to the first x-alignment limit, and the second offset x-axis separation distance $x_{34f}$ may not be equal to a second x-alignment limit. When the first target pattern 301$f$ and an offset second target pattern 302$f$ are not aligned as shown in FIG. 3$f$, the overlay error data can be determined using the difference between the first x-axis separation distance $x_{14e}$ and the first offset x-axis separation distance $x_{14f}$. In addition, overlay error data can be determined using the difference between the second x-axis separation distance $x_{34e}$ and the second offset x-axis separation distance $x_{34f}$.

As additionally shown in the third overlay arrangement 393, there can be a first y-axis separation distance $y_{25e}$ between the second segmented lines 320$e$ in the first target layer 361$e$ and the fifth segmented lines 350$e$ in the second target layer 362$e$ and the first y-axis separation distance $y_{25e}$ can be used to calculate the overlay error in the y-direction. The first y-axis separation distance $y_{25e}$ can range from a negative value to a positive value, and the second elements 321$e$ in the first target layer 361$e$ can be aligned with the fifth elements 351$e$ in the second target layer 362$e$ in the x-direction. Alternatively, the second elements 321$e$ in the first target layer 361$e$ may not be aligned with the fifth elements 351$e$ in the second target layer 362$e$.

Referring to the fourth overlay arrangement 394, there can be a first offset y-axis separation distance $y_{25f}$ between the second segmented lines 320$f$ in the first target layer 361$f$ and the offset fifth segmented lines 350$f$ in the offset second target layer 362$f$ and the first offset y-axis separation distance $y_{25f}$ can be used to calculate the overlay error in the y-direction. The first offset y-axis separation distance $y_{25f}$ can range from a negative value to a positive value, and the second elements 321$f$ in the first target layer 361$f$ can be aligned with the offset fifth elements 351$f$ in the offset second target layer 362$f$ in the x-direction. Alternatively, the second elements 321$f$ in the first target layer 361$f$ may not be aligned with the offset fifth elements 351$f$ in the offset second target layer 362$f$.

As additionally shown in the third overlay arrangement 393, there can be a second y-axis separation distance $y_{35e}$ between the third segmented lines 330e in the first target layer 361e and the fifth segmented lines 350e in the second target layer 362e and the second y-axis separation distance $y_{35e}$ can also be used to calculate the overlay error in the y-direction. The second y-axis separation distance $y_{35e}$ can range from a negative value to a positive value, and the third elements 331e in the first target layer 361e can be aligned with the fifth elements 351e in the second target layer 362e in the y-direction. Alternatively, the third elements 331e in the first target layer 361e may not be aligned with the fifth elements 351e in the second target layer 362e.

Referring to the fourth overlay arrangement 394, there can be a second offset y-axis separation distance $y_{35f}$ between the third segmented lines 330f in the first target layer 361f and the offset fifth segmented lines 350f in the offset second target layer 362f and the second offset y-axis separation distance $y_{35f}$ can be used to calculate the overlay error in the y-direction. The second offset y-axis separation distance $y_{35f}$ can range from a negative value to a positive value, and the third elements 331f in the first target layer 361f can be aligned with the offset fifth elements 351f in the offset second target layer 362f in the x-direction. Alternatively, the third elements 331f in the first target layer 361f may not be aligned with the offset fifth elements 351f in the offset second target layer 362f.

As shown in FIG. 3e, when the third overlay arrangement 393 is in an "aligned state", the first y-axis separation distance $y_{25e}$ can be equal to a first y-alignment limit, and the second y-axis separation distance $y_{35e}$ can be equal to a second y-alignment limit. As shown in FIG. 3f, when the fourth overlay arrangement 394 is in a "non-aligned state", the first offset y-axis separation distance $y_{25f}$ may not be equal to the first y-alignment limit, and the second offset y-axis separation distance $y_{35f}$ may not be equal to the second y-alignment limit. When the first target pattern 301f and an offset second target pattern 302f are not aligned as shown in FIG. 3f, the overlay error data can be determined using the difference between the first y-axis separation distance $y_{25e}$ and the first offset y-axis separation distance $y_{25f}$. In addition, overlay error data can be determined using the difference between the second y-axis separation distance $y_{35e}$ and the second offset y-axis separation distance $y_{35f}$.

Figure 3G:
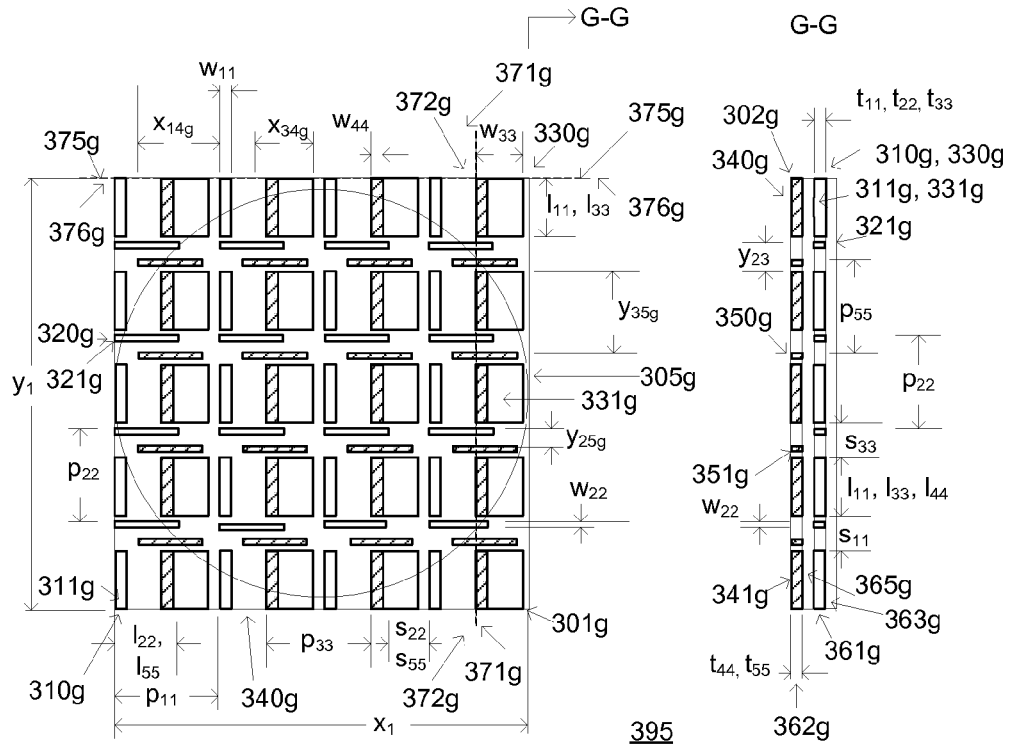
Figure 3H:
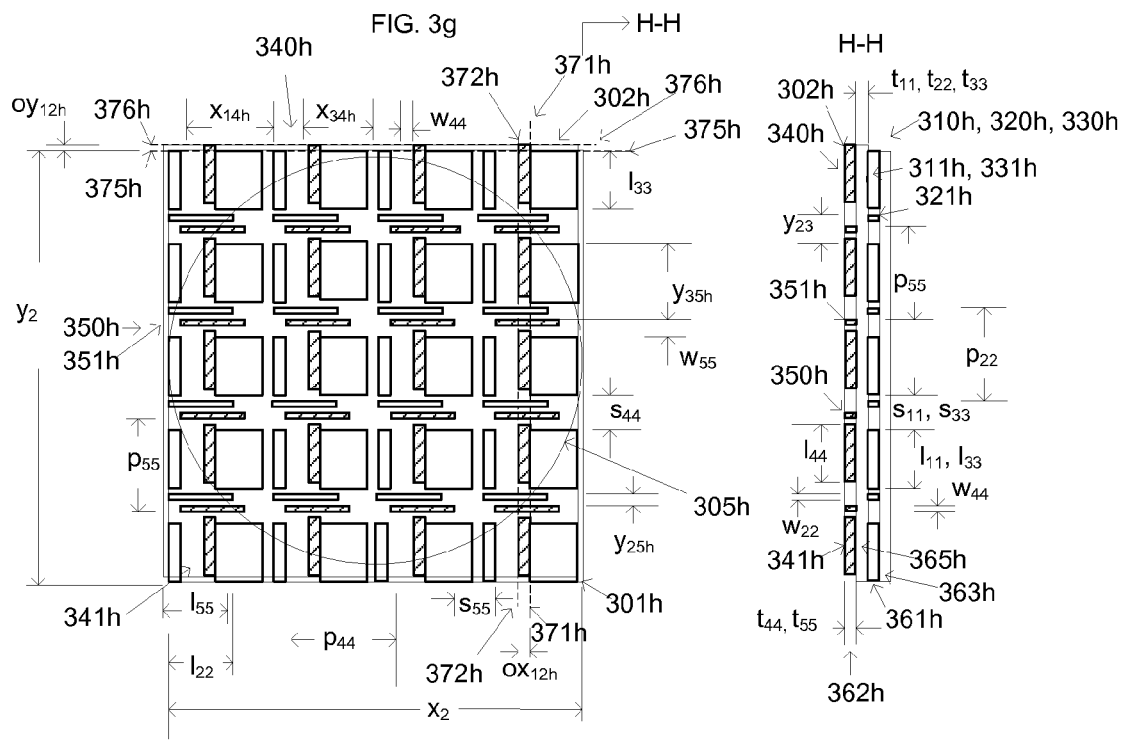

FIGS. 3g and 3h illustrate additional exemplary overlay arrangements in accordance with embodiments of the invention. A fifth overlay arrangement 395 is illustrated in FIG. 3g, and a sixth overlay arrangement 396 is illustrated in FIG. 3h. For example, the fifth overlay arrangement 395 can be used to show an aligned state, the sixth overlay arrangement 396 can be used to show a non-aligned state, and like dimensions and elements can be illustrated by the same or similar reference numbers. Exemplary spot sizes 305g and 305h are also shown.

In FIG. 3g, a first target pattern 301g is illustrated in one target layer 361g, a second target pattern 302g is illustrated in another target layer 362g, and a substrate layer 363g is shown. In addition, an interface layer 365g is shown between the first target layer 361g and the second target layer 362g. For example, the first target pattern 301g can be created in a masking layer for producing a first set of structures using a first D-P processing sequence and the second target pattern 302g can be used as mask for producing a second set of structures using a second D-P processing sequence. The interface layer 365g can include planarization material or other material.

When the first target pattern 301g and a second target pattern 302g are aligned in a first direction as shown in FIG. 3g, the first x-alignment plane 371g in the first target pattern 301g can be aligned with the second x-alignment plane 372g in the second target pattern 302g. When the first target pattern 301g and a second target pattern 302g are aligned in a second direction as shown in FIG. 3g, the first y-alignment plane 375g in the first target pattern 301g can be aligned with the second y-alignment plane 376g in the second target pattern 302g.

When the first target pattern 301g and a second target pattern 302g are aligned as shown in FIG. 3g, the fourth segmented lines 340g in the second target pattern 302g can be aligned in the y-direction with the first segmented lines 310g and the third segmented lines 330g in the first target pattern 301g.

In FIG. 3h, a first target pattern 301h is illustrated in one target layer 361h, an offset second target pattern 302h is illustrated in another target layer 362h, and a substrate layer 363h is shown. In addition, an interface layer 365h is shown between the first target layer 361h and the offset second target layer 362h. For example, the first target pattern 301h can be created in a masking layer for producing a first set of structures using a first D-P processing sequence and the offset second target pattern 302h can be used as mask for producing a second set of structures using a second D-P processing sequence after the alignment error is corrected. The interface layer 365h can include planarization material or other material.

When the first target pattern 301h and an offset second target pattern 302h are not aligned as shown in FIG. 3h, the first x-alignment plane 371h in the first target pattern 301h can be offset by a first x-axis value $(ox_{12h})$ in the x-direction from second x-alignment plane 372h in the offset second target pattern 302h. In some examples, the first x-axis offset value $(ox_{12h})$ in the x-direction can range from a negative value to a positive value, and the first x-axis offset value $(ox_{12h})$ can range from approximately −500 nm to approximately +500 nm. In other examples, the first x-axis offset value $(ox_{12h})$ can range from approximately −100 nm to approximately +100 nm. In alternate embodiments, the first x-axis offset value $(ox_{12h})$ may be dependent upon the first period $p_{11}$, the second period $p_{22}$, the third period $p_{33}$, the fourth period $p_{44}$, or the fifth period $p_{55}$, or any combination thereof. In other examples, the first x-axis offset value $(ox_{12h})$ can range from approximately −100 nm to approximately +100 nm. In other alternate embodiments, the first x-axis offset value $(ox_{12h})$ may be dependent upon the first width $w_{11}$, the second width $w_{22}$, the third width $w_{33}$, the fourth width $w_{44}$, or the fifth width $w_{55}$, or any combination thereof.

When the first target pattern 301h and an offset second target pattern 302h are not aligned as shown in FIG. 3h, the first y-alignment plane 375h in the first target pattern 301h can be offset by a first y-axis value $(oy_{12h})$ in the y-direction from the offset second y-alignment plane 376h in the offset second target pattern 302h. In some examples, the first y-axis offset value $(oy_{12h})$ in the y-direction can range from a negative value to a positive value, and the first y-axis offset value $(oy_{12h})$ can range from approximately −500 nm to approximately +500 nm. In other examples, the first y-axis offset value $(oy_{12h})$ can range from approximately −100 nm to approximately +100 nm. In alternate embodiments, the first y-axis offset value $(oy_{12h})$ may be dependent upon the first period $p_{11}$, the second period $p_{22}$, the third period $p_{33}$, the fourth period $p_{44}$, or the fifth period $p_{55}$, or any combination thereof. In other examples, the first y-axis offset value $(oy_{12h})$ can range from approximately −100 nm to approximately +100 nm. In other alternate embodiments, the first y-axis offset value $(oy_{12h})$ may be dependent upon the first width $w_{11}$, the second width $w_{22}$, the third width $w_{33}$, the fourth width $w_{44}$, or the fifth width $w_{55}$, or any combination thereof.

In some embodiments, the first x-alignment plane 371$h$ in the first target pattern 301$h$ can be substantially parallel to the y-axis, and the offset second x-alignment plane 372$h$ in the offset second target pattern 302$h$ can also be substantially parallel to the y-axis. Alternatively, the first x-alignment plane 371$h$ in the first target pattern 301$h$ may not be substantially parallel to the y-axis, and the offset second x-alignment plane 372$h$ in the offset second target pattern 302$h$ may also not be substantially parallel to the y-axis. In addition, the first y-alignment plane 375$h$ in the first target pattern 301$h$ can be substantially parallel to the x-axis, and the offset second y-alignment plane 376$h$ in the offset second target pattern 302$h$ can also be substantially parallel to the x-axis. Alternatively, the first y-alignment plane 375$h$ in the first target pattern 301$h$ may not be substantially parallel to the x-axis, and the offset second y-alignment plane 376$h$ in the offset second target pattern 302$h$ may also not be substantially parallel to the x-axis.

As shown in FIG. 3$g$, when the fifth overlay arrangement 395 is in an "aligned state", there can be a first x-axis separation distance $x_{14g}$ between the first segmented lines 310$g$ in the first target layer 361$g$ and the fourth segmented lines 340$g$ in the second target layer 362$g$ and the first x-axis separation distance $x_{14g}$ can be used to calculate the overlay error in the x-direction. The first x-axis separation distance $x_{14g}$ can range from a negative value to a positive value, and the first elements 311$g$ in the first target layer 361$g$ can be aligned with the fourth elements 341$g$ in the second target layer 362$g$ in the y-direction. Alternatively, the first elements 311$g$ in the first target layer 361$g$ may not be aligned with the fourth elements 341$g$ in the second target layer 362$g$.

As shown in FIG. 3$h$, the sixth overlay arrangement 396 shows another "non-aligned state", there can be a first offset x-axis separation distance $x_{14h}$ between the first segmented lines 310$h$ in the first target layer 361$h$ and the offset fourth segmented lines 340$h$ in the offset second target layer 362$h$ and the first offset x-axis separation distance $x_{14h}$ can be used to calculate the overlay error in the x-direction. The first offset x-axis separation distance $x_{14h}$ can range from a negative value to a positive value, and the first elements 311$h$ in the first target layer 361$h$ can be aligned with the offset fourth elements 341$h$ in the offset second target layer 362$h$ in the y-direction. Alternatively, the first elements 311$h$ in the first target layer 361$h$ may not be aligned with the offset fourth elements 341$h$ in the offset second target layer 362$h$.

As shown in FIG. 3$g$, when the third overlay arrangement 395 is in an "aligned state", there can be a second x-axis separation distance $x_{34g}$ between the third segmented lines 330$g$ in the first target pattern 301$g$ in the first target layer 361$g$ and the fourth segmented lines 340$g$ in the second target pattern 302$g$ in the second target layer 362$g$ and the second x-axis separation distance $x_{34g}$ can also be used to calculate the overlay error in the x-direction. The second x-axis separation distance $x_{34g}$ can range from a negative value to a positive value, and the third elements 331$g$ in the first target layer 361$g$ can be aligned with the fourth elements 341$g$ in the second target layer 362$g$ in the y-direction. Alternatively, the third elements 331$g$ in the first target layer 361$g$ may not be aligned with the fourth elements 341$g$ in the second target layer 362$g$.

As shown in FIG. 3$h$, when the sixth overlay arrangement 396 is in an "non-aligned state", there can be a different second x-axis separation distance $x_{34h}$ between the third segmented lines 330$h$ in the first target layer 361$h$ and the offset fourth segmented lines 340$h$ in the offset second target layer 362$h$ and the second x-axis separation distance $x_{34h}$ can be used to calculate the overlay error in the x-direction. The different second x-axis separation distance $x_{34h}$ can range from a negative value to a positive value, and the third elements 331$h$ in the first target layer 361$h$ can be aligned with the offset fourth elements 341$h$ in the offset second target layer 362$h$ in the y-direction. Alternatively, the third elements 331$h$ in the first target layer 361$h$ may not be aligned with the offset fourth elements 341$h$ in the offset second target layer 362$h$.

As shown in FIG. 3$g$, when the fifth overlay arrangement 395 is in an "aligned state", the first x-axis separation distance $x_{14g}$ can be equal to a first x-alignment limit, and the second x-axis separation distance $x_{34g}$ can be equal to a second x-alignment limit. As shown in FIG. 3$h$, when the sixth overlay arrangement 396 is in a "non-aligned state", the first offset x-axis separation distance $x_{14h}$ may not be equal to the first x-alignment limit, and the second offset x-axis separation distance $x_{34h}$ may not be equal to a second x-alignment limit. When the first target pattern 301$h$ and an offset second target pattern 302$h$ are not aligned as shown in FIG. 3$h$, the overlay error data can be determined using the difference between the first x-axis separation distance $x_{14g}$ and the first offset x-axis separation distance $x_{14h}$. In addition, overlay error data can be determined using the difference between the second x-axis separation distance $x_{34g}$ and the second offset x-axis separation distance $x_{34h}$.

As additionally shown in the fifth overlay arrangement 395, there can be a first y-axis separation distance $y_{25g}$ between the second segmented lines 320$g$ in the first target layer 361$g$ and the fifth segmented lines 350$g$ in the second target layer 362$g$ and the first y-axis separation distance $y_{25g}$ can be used to calculate the overlay error in the y-direction. The first y-axis separation distance $y_{25g}$ can range from a negative value to a positive value, and the second elements 321$g$ in the first target layer 361$g$ can be aligned with the fifth elements 351$g$ in the second target layer 362$g$ in the x-direction. Alternatively, the second elements 321$g$ in the first target layer 361$g$ may not be aligned with the fifth elements 351$g$ in the second target layer 362$g$.

Referring to the sixth overlay arrangement 396, there can be a first offset y-axis separation distance $y_{25h}$ between the second segmented lines 320$h$ in the first target layer 361$h$ and the offset fifth segmented lines 350$h$ in the offset second target layer 362$h$ and the first offset y-axis separation distance $y_{25h}$ can be used to calculate the overlay error in the y-direction. The first offset y-axis separation distance $y_{25h}$ between the second segmented lines 320$h$ and the offset fifth segmented lines 350$h$ can range from a negative value to a positive value, and the second elements 321$h$ in the first target layer 361$h$ can be aligned with the offset fifth elements 351$h$ in the offset second target layer 362$h$ in the x-direction. Alternatively, the second elements 321$h$ in the first target layer 361$h$ may not be aligned with the offset fifth elements 351$h$ in the offset second target layer 362$h$.

As additionally shown in the fifth overlay arrangement 395, there can be a second y-axis separation distance $y_{35g}$ between the third segmented lines 330$g$ in the first target layer 361$g$ and the fifth segmented lines 350$g$ in the second target layer 362$g$ and the second y-axis separation distance $y_{35g}$ can also be used to calculate the overlay error in the y-direction. The second y-axis separation distance $y_{35g}$ between the third segmented lines 330$g$ and the fifth segmented lines 350$g$ can range from a negative value to a positive value, and the third elements 331$g$ in the first target layer 361$g$ can be aligned with the fifth elements 351$g$ in the second target layer 362$g$ in the y-direction. Alternatively, the third elements 331$g$ in the first target layer 361g may not be aligned with the fifth elements 351g in the second target layer 362g.

Referring to the sixth overlay arrangement 396, there can be a second offset y-axis separation distance $y_{35h}$ between the third segmented lines 330h in the first target layer 361h and the offset fifth segmented lines 350h in the offset second target layer 362h and the second offset y-axis separation distance $y_{35h}$ can be used to calculate the overlay error in the y-direction. The second offset y-axis separation distance $y_{35h}$ between the third segmented lines 330h and the offset fifth segmented lines 350h can range from a negative value to a positive value, and the third elements 331h in the first target layer 361h can be aligned with the offset fifth elements 351h in the offset second target layer 362h in the x-direction. Alternatively, the third elements 331h in the first target layer 361h may not be aligned with the offset fifth elements 351h in the offset second target layer 362h.

As shown in FIG. 3g, when the fifth overlay arrangement 395 is in an "aligned state", the first y-axis separation distance $y_{25g}$ can be equal to a first y-alignment limit, and the second y-axis separation distance $y_{35g}$ can be equal to a second y-alignment limit. As shown in FIG. 3h, when the sixth overlay arrangement 396 is in a "non-aligned state", the first offset y-axis separation distance $y_{25h}$ may not be equal to the first y-alignment limit, and the second offset y-axis separation distance $y_{35h}$ may not be equal to the second y-alignment limit. When the first target pattern 301h and an offset second target pattern 302h are not aligned as shown in FIG. 3h, the overlay error data can be determined using the difference between the first y-axis separation distance $y_{25g}$ and the first offset y-axis separation distance $y_{25h}$. In addition, overlay error data can be determined using the difference between the second y-axis separation distance $y_{35g}$ and the second offset y-axis separation distance $y_{35h}$.

Figure 4:
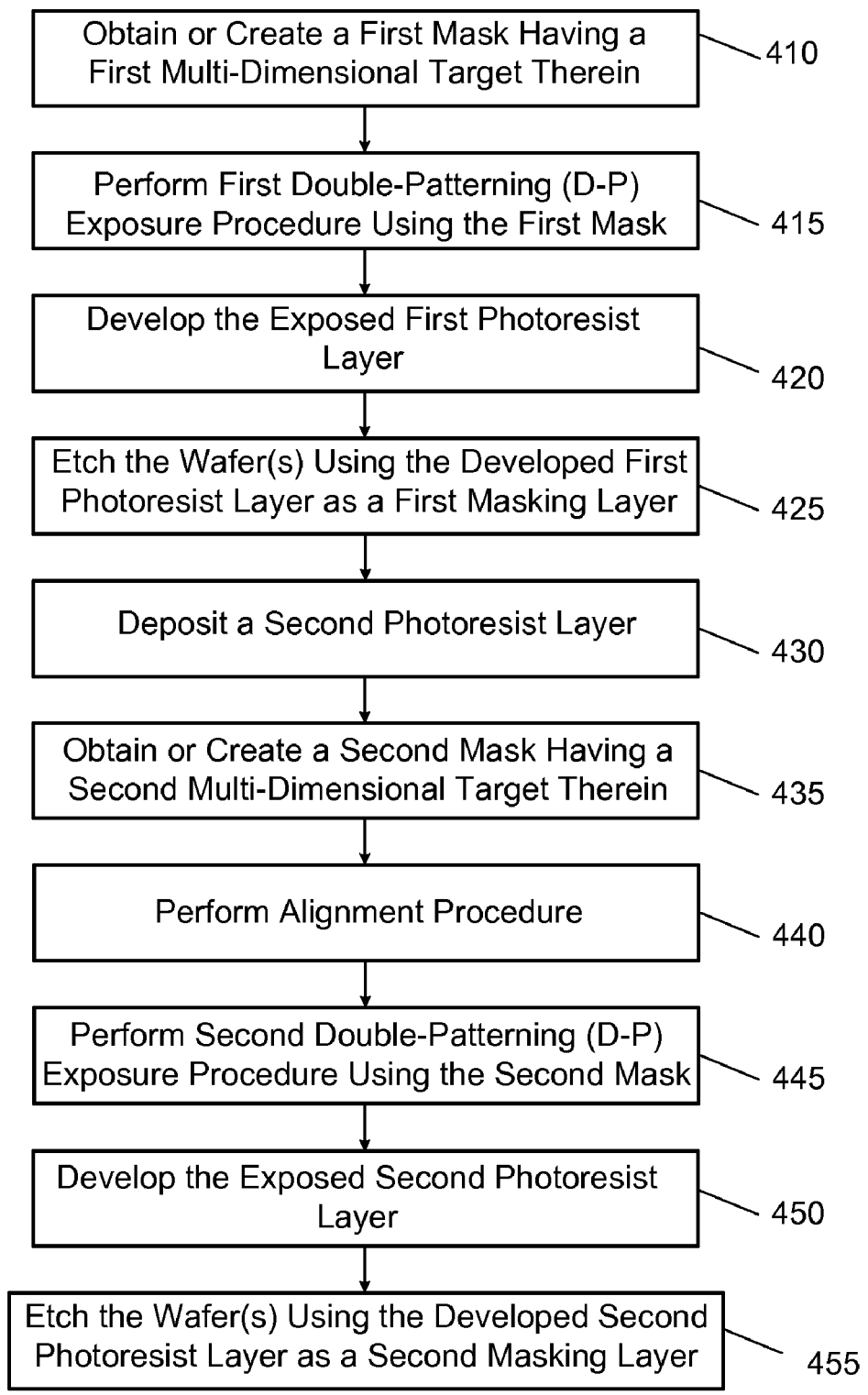
FIG. 4 shows an exemplary flow diagram of another procedure for processing wafers in accordance with embodiments of the invention.

FIG. 4 shows an exemplary flow diagram of another procedure for processing wafers in accordance with embodiments of the invention. In the illustrated embodiment, an exemplary procedure 400 is shown for using one or more multi-dimensional targets in one or more masks for aligning two different D-P patterns in two different masking layers during wafer processing.

In 410, a first mask can be created or obtained that includes one or more first multi-dimensional targets therein, and each first multi-dimensional target can include a plurality of first segmented lines, a plurality of second segmented lines perpendicular to the plurality of first segmented lines, and a plurality of third segmented lines parallel to the plurality of first segmented lines. For example, the first multi-dimensional target can be as shown in FIGS. 3a-3h. Alternatively, other configurations may be used. In addition, the first mask can include a first set of image features (first image pattern) for creating a first set of structures on a wafer.

When a first multi-dimensional target is created in a first mask, two or more first segmented lines can be created, each first segmented line can be aligned in a first direction and can have two or more first segments separated by a first separation distance. The two or more first segmented lines can be separated from each other by a first period, and each first segment can have a first length and a first width. Two or more second segmented lines can also be created in the first mask. Each second segmented line can be aligned in a second direction and can have two or more second segments separated by a second separation distance. The two or more second segmented lines can be separated from each other by a second period, and each second segment can have a second length and a second width. In addition, two or more third segmented lines can be created in the first mask. Each third segmented line can be aligned in the first direction and can have two or more third segments separated by a third separation distance. The two or more third segmented lines can be separated from each other by a third period, and each third segment can have a third length and a third width.

In 415, a first D-P exposure procedure can be performed. In some cases, a portion of a first photoresist layer can be exposed on a wafer using the first mask and a radiation source, and the first portion of the exposed first photoresist layer can include one or more first target areas that can have a latent image of the first multi-dimensional target therein. Alternatively, target areas may not be required. In addition, the first portion of the exposed first photoresist layer can include the latent images for the first set of structures on the wafer. Subsequently, the first mask can be used to establish other target areas and additional latent images over additional portions of the wafer. For example, step and repeat techniques can be performed by one or more scanner-related subsystems.

In 420, the exposed first photoresist layer can be developed. For example, one or more of a first set of D-P wafers can be transferred to one or more of the lithography subsystems 110, and one or more of the processing elements 112 can be used to develop the exposed first photoresist layer. One or more of the processing elements 112 can be used for thermal processing (baking), and one or more of the evaluation elements 115 can be used to measure and/or inspect one or more of the developed photoresist layers. In some D-P sequences, one or more of the features and/or structures in the first photoresist layer can be measured using optical techniques to verify correct performance.

In 425, the developed first photoresist layer can be used in one or more etching processes. For example, one or more of a first set of D-P wafers can be transferred to one or more of the etch subsystems 130, and one or more of the processing elements 132 can be used to perform one or more etching processes using the developed photoresist layer as a masking layer. One or more of the processing elements 132 can be used for cleaning or trimming, and one or more of the evaluation elements 125 can be used to measure and/or inspect one or more of the etched layers.

In 430, a second masking layer can be created on top of the one or more etched layers. In some examples, the one or more etched layers can be illustrated by layers 361e in FIGS. 3e and 361f in FIG. 3f, and the second masking layer can be illustrated by layer 362e in FIGS. 3e and 362f FIG. 3f. In other examples shown in FIG. 3g and FIG. 3h, the one or more etched layers can be illustrated by layers 361g in FIGS. 3g and 361h in FIG. 3h, that can be covered by one or more intermediate materials that can be illustrated by layer 365h, and the second masking layer can be illustrated by layers 362g in FIGS. 3g and 362h in FIG. 3h.

In 435, a second mask can be created or obtained that includes one or more second multi-dimensional targets therein, and the second multi-dimensional target can include a plurality of fourth segmented lines, and a plurality of fifth segmented lines perpendicular to the plurality of fourth segmented lines. For example, the second multi-dimensional target can be as shown in FIG. 3b. Alternatively, other configurations may be used. In addition, the second mask can include a second set of image features (second image pattern) for creating a second set of structures on a wafer.

When a second multi-dimensional target is created in a second mask, two or more fourth segmented lines can be created. Each fourth segmented line can be aligned in a first direction and can have two or more fourth segments separated by a fourth separation distance. The two or more fourth segmented lines can be separated from each other by a fourth period, and each fourth segment can have a fourth length and a fourth width. In addition, two or more fifth segmented lines can be created. Each fifth segmented line can be aligned in a second direction and can have two or more fifth segments separated by a fifth separation distance. The two or more fifth segmented lines can be separated from each other by a fifth period, and each fifth segment can have a fifth length and a fifth width.

In 440, one or more alignment procedures can be performed. In some D-P processing sequences, the second mask can be aligned with the first portion of a first etch layer using an "etched copy" of the first multi-dimensional target and the second multi-dimensional target in the second mask. For example, the alignment can take place in a scanner-related subsystem.

In some embodiment, a first alignment plane can be established in a first direction and a second alignment plane can be established in a second direction in the "etched copy" of the first multi-dimensional target, and a third alignment plane can be established in the first direction and a fourth alignment plane can be established in the second direction in the second multi-dimensional target. A first alignment offset limit can be established in the first direction, and a second alignment offset limit can be established in the second direction. A first alignment offset can be determined in the first direction using a first difference between the first alignment plane and the third alignment plane, and a second alignment offset can be determined in the second direction using a second difference between the second alignment plane and the fourth alignment plane. The alignment can be performed by minimizing a first difference between the first alignment offset and the first alignment offset limit, and minimizing a second difference between the second alignment offset and the second alignment offset limit.

In other embodiments, a first x-axis alignment plane and a first y-axis alignment plane can be established in the "etched copy" of the first multi-dimensional target, and a second x-axis alignment plane and a second y-axis alignment plane can be established in the second multi-dimensional target. A first alignment offset limit can be established in the first direction, and a second alignment offset limit can be established in the second direction. A first alignment offset can be determined using a first difference between the first x-axis alignment plane and the second x-axis alignment plane, and a second alignment offset can be determined using a second difference between the first y-axis alignment plane and the second y-axis alignment plane. The alignment can be performed by minimizing a first difference between the first alignment offset and the first alignment offset limit, and minimizing a second difference between the second alignment offset and the second alignment offset limit.

In still other embodiments, a first alignment offset can be determined in the first direction using a first difference between one or more of the third segmented lines in the first multi-dimensional target and one or more of the fourth segmented lines in the second multi-dimensional target. For example, each element in the third segmented line can be wider than each element in the fourth segmented line. A second alignment offset can be determined in the second direction using a second difference between one or more of the third segmented lines in the first multi-dimensional target and one or more of the fifth segmented lines in the second multi-dimensional target. For example, each element in the third segmented line can be wider than each element in the fifth segmented line.

In addition, a refined first alignment offset can be established in the first direction using a second difference between one or more of the first segmented lines in the first multi-dimensional target and one or more of the fourth segmented lines in the second multi-dimensional target. A refined second alignment offset can be established in the second direction using a second difference between one or more of the second segmented lines in the first multi-dimensional target and one or more of the fifth segmented lines in the second multi-dimensional target. Then, the new first difference between the refined first alignment offset and the first alignment offset limit and the new second difference between the refined second alignment offset and the second alignment offset limit can be minimized.

In additional embodiments, a first alignment offset can be determined in the first direction using a first difference between one or more of the first segmented lines in the first multi-dimensional target and one or more of the fourth segmented lines in the second multi-dimensional target. For example, each element in the first segmented line being wider than each element in the fourth segmented line. A second alignment offset can be determined in the second direction using a second difference between one or more of the second segmented lines in the first multi-dimensional target and one or more of the fifth segmented lines in the second multi-dimensional target. For example, each element in the second segmented line being wider than each element in the second segmented line.

In 445, when a correct alignment procedure has been performed, a second D-P procedure can be performed. In some examples, the second masking (photoresist) layer can be exposed on a wafer using the second mask and a radiation source, and the exposed portion of the second photoresist layer can include one or more second target areas that can have a latent image of the second multi-dimensional target therein. Alternatively, target areas may not be required. In addition, the exposed portion of the second photoresist layer can include the latent images for the second set of structures on the wafer. Subsequently, the second mask can be used to establish other target areas and additional latent images over additional portions of the wafer. For example, step and repeat techniques can be performed by one or more scanner-related subsystems.

In 450, the exposed second photoresist layer can be developed. For example, one or more of the D-P wafers 105 can be transferred to one or more of the lithography subsystems 110, and one or more of the processing elements 112 can be used to develop the exposed second photoresist layer. One or more of the processing elements 112 can be used for thermal processing (baking), and one or more of the evaluation elements 115 can be used to measure and/or inspect one or more of the developed second photoresist layers.

In 455, the developed second photoresist layer can be used in one or more etching processes to create a second set of structures on each wafer. For example, one or more D-P wafers can be transferred to one or more of the etch subsystems 130, and one or more of the processing elements 132 can be used to perform one or more etching using the developed second photoresist layer as a second masking layer. One or more of the processing elements 132 can be used for cleaning or trimming, and one or more of the evaluation elements 135 can be used to measure and/or inspect one or more of the etched layers.

In various embodiments, the one or more masking layers can include photoresist material, and/or anti-reflective coating (ARC) material.

Verified D-P pattern creation sequences can be used to create verified D-P patterns, and the verified D-P pattern creation sequences can be stored in a D-P library. When a verified pattern creation sequence is performed, one or more reference (verified) D-P patterns can be created at one or more sites on each of the processed wafers, and the data associated with the one or more reference (verified) D-P patterns can be stored in a D-P library. When an unverified D-P procedure is performed, one or more unverified D-P patterns can be created at one or more sites on each of the processed wafers. The first set of reference (verified) D-P patterns could include a first verification D-P pattern at a first site on the first processed wafer.

In some embodiments, a first group of wafers can be established that can be used to obtain the D-P library data. The data from the first group of wafers can be used for creating and/or refining data in the D-P library. The first group can include one or more reference "golden" wafers, and a number of required verification sites can be established for each reference "golden" wafer. For example, a reference "golden" wafer can be produced using verified "golden" procedures performed using verified "golden" processing elements and/or evaluation elements. In addition, when the number of reference wafers is greater than the number of available "golden" elements, a first set of delayed reference "golden" wafers can be established, and one or more of the delayed reference "golden" wafers can be stored using one or more of the transfer/storage elements (112, 122, 132, 142, 152, and 162) and/or the transfer subsystem 170.

In addition, the first group can include one or more test wafers, and a number of required verification sites can be established for each test wafer. For example, a test wafer can be produced using unverified procedures performed using verified and/or unverified processing elements and/or evaluation elements. In addition, when the number of test wafers is greater than the number of available elements, a first set of delayed test wafers can be established, and one or more of the delayed test wafers can be stored using one or more of the transfer/storage elements (112, 122, 132, 142, 152, and 162) and/or the transfer subsystem 170.

After a verified D-P sequence is performed, one or more reference "golden" D-P patterns can be produced at one or more sites on each of the reference "golden" wafers. When a first reference "golden" wafer is determined, a first site can be selected from the number of required sites on the first reference "golden" wafer, and the first site can have a first reference "golden" pattern associated therewith that was created using the one or more verified procedures in the verified D-P sequence. First pattern verification/evaluation data can be obtained from the first site on the first wafer, and additional pattern verification/evaluation data can be obtained from additional sites on the first wafer or on additional wafers. The pattern verification/evaluation data can include pattern-related measurement, evaluation, and/or inspection data. In addition, simulated and/or predicted data can be established for one or more D-P patterns and/or structures at one or more sites on one or more wafers.

First pattern verification/evaluation data can be obtained from the first site on the first wafer, and additional pattern verification/evaluation data can be obtained from additional sites on the first wafer or on additional wafers. The pattern verification/evaluation data can include pattern-related measurement, evaluation, and/or inspection data. In addition, simulated and/or predicted data can be established for one or more D-P patterns and/or structures at one or more sites on one or more wafers.

The D-P data can include profile data and optical data associated with the profile data, and the library data can include image data and optical data associated with the image data. The library data can include data for single layer targets, multi-layer targets, partially-etched targets, protected targets, etched targets, trimmed targets, doping targets, filled targets, semi-filled targets damaged targets, capacitor targets, gate targets, transistor targets, targets for FinFET structures, targets for Complementary Metal-Oxide Semiconductor (CMOS) structures, targets for pFET structures, targets for nFET structures, targets in photoresists, periodic targets, alignment targets, targets for trench structures, targets for via structures, array targets, grating targets, or any combination thereof. In addition, the library data can include data for single layer targets, multi-layer targets, partially-etched structures, protected structures, etched structures, trimmed structures, doped structures, filled structures, semi-filled structures, damaged structures, capacitor structures, gate structures, gate electrode structures, gate stack structures, transistor structures, FinFET structures, Complementary Metal-Oxide Semiconductor (CMOS) structures, pFET structures, nFET structures, photoresist structures, periodic structures, alignment structures, trench structures, via structures, array structures, grating structures, or any combination thereof. Furthermore, the library data can include modeling data, historical data, or real-time data or any combination thereof may be used.

Confidence and/or risk data can be established for the D-P data using differences calculated using the measured data and the simulated data. When one or more confidence limits are met, the D-P data can be identified and/or stored as verified data in a D-P library. When one or more confidence limits are not met, the D-P data can be identified and/or stored as unverified data in a D-P library. The D-P data can be characterized by a set of wavelengths established for each D-P procedure.

When a D-P processing sequence includes lithography-related procedures, one or more verified lithography procedures can be performed, and one or more verified and/or verifiable lithography-related evaluation features can be created at one or more lithography-related evaluation sites on one or more of the D-P wafers. Data can be created in real time during a verified lithography procedure and can include process data, system data, chamber data, chamber match data, particle data, image data, and/or fault data. The lithography-related data can be fed forward and/or fed back to change/update process recipes.

When the first D-P sequence includes scanner-related procedures, one or more verified scanner procedures can be performed, and one or more verified and/or verifiable scanner-related evaluation features can be created at one or more scanner-related evaluation sites on one or more of the D-P wafers. Data can be created in real time during a verified scanner procedure and can include process data, system data, chamber data, chamber match data, particle data, image data, and/or fault data. The scanner-related data can be fed forward and/or fed back to change/update process recipes.

When the first D-P sequence includes etch-related procedures, one or more verified etch procedures can be performed, and one or more verified and/or verifiable etch-related evaluation features can be created at one or more etch-related evaluation sites on one or more of the D-P wafers. Data can be created in real time during a verified etch procedure and can include process data, system data, chamber data, chamber match data, particle data, image data, and/or fault data. The etch-related data can be fed forward and/or fed back to change/update process recipes.

When the first D-P sequence includes deposition-related procedures, one or more verified deposition procedures can be performed, and one or more verified and/or verifiable deposition-related evaluation features can be created at one or more deposition-related evaluation sites on one or more of the D-P wafers. Data can be created in real time during a verified deposition procedure and can include process data, system data, chamber data, chamber match data, particle data, image data, and/or fault data. The deposition-related data can be fed forward and/or fed back to change/update process recipes.

When all of the procedures in the first D-P sequence are completed, a first verified and/or verifiable D-P pattern can be created at one or more pre-determined evaluation sites on one or more of the D-P wafers. When the first pattern is evaluated and/or verified, data can be created in real time and can be fed forward and/or fed back to change/update process recipes.

In addition, when judgment and/or intervention rules are associated with D-P procedures, they can be executed. Intervention and/or judgment rule evaluation procedures and/or limits can be performed based on historical procedures, on the customer's experience, or process knowledge, or obtained from a host computer. D-P-related rules can be used in FDC procedures to determine how to respond to alarm conditions, error conditions, fault conditions, and/or warning conditions. The D-P-related FDC procedures can prioritize and/or classify faults, predict system performance, predict preventative maintenance schedules, decrease maintenance downtime, and extend the service life of consumable parts in the system.

A D-P procedure can be specified by a semiconductor manufacturer based on data stored in a historical database. For example, a semiconductor manufacturer may have historically chosen a number of sites on the wafer when making SEM measurements and would like to correlate the evaluation data to the data measured using a SEM system, TEM system and/or FIB system. In addition, the number of evaluation sites used can be reduced as the manufacturer becomes more confident that the process is and will continue to produce high quality products and/or devices.

Before, during, and/or after a D-P procedure is performed, simulation, modeling and/or prediction data can be created and/or modified. The new simulation and/or prediction data can be used in real time to update the calculations, models, and/or D-P procedures. For example, prediction models can include process chemistry models, chamber models, EM models, SPC charts, PLS models, PCA models, FDC models, and Multivariate Analysis (MVA) models.

The historical data can include GOF data, thermal data, thickness data, via-related data, CD data, CD profile data, material related data, trench-related data, sidewall angle data, differential width data, or any combination thereof. The data can also include site result data, site number data, CD measurement flag data, number of measurement sites data, coordinate X data, and coordinate Y data, among others.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method of aligning layers on a wafer comprising:
creating a first multi-dimensional target in a first mask, the first multi-dimensional target comprising a plurality of first segmented lines, a plurality of second segmented lines perpendicular to the plurality of first segmented lines, and a plurality of third segmented lines parallel to the plurality of first segmented lines;
establishing a first patterned layer on the wafer, the first patterned layer comprising a first target area having the first multi-dimensional target therein;
creating a second multi-dimensional target in a second mask, the second multi-dimensional target comprising a plurality of fourth segmented lines, and a plurality of fifth segmented lines perpendicular to the plurality of fourth segmented lines; and
aligning the second mask with the first patterned layer on the wafer using the first multi-dimensional target and second multi-dimensional target.

2. The method of claim 1, further comprising:
creating the plurality of first segmented lines by aligning a plurality of first segments in a first direction wherein the plurality of first segments are separated by first separation distances $s_{11}$, a first segment having a first length $l_{11}$ and a first width $w_{11}$, wherein the plurality of first segmented lines are separated by first periods $p_{11}$;
creating the plurality of second segmented lines by aligning a plurality of second segments in a second direction wherein the plurality of second segments are separated by second separation distances $s_{22}$, a second segment having a second length $l_{22}$ and a second width $w_{22}$, wherein the plurality of second segmented lines are separated by second periods $p_{22}$; and
creating the plurality of third segmented lines by aligning a plurality of third segments in the first direction wherein the plurality of third segments are separated by third separation distances $s_{33}$, a third segment having a third length $l_{33}$ and a third width $w_{33}$, wherein the plurality of third segmented lines are separated by third periods $p_{33}$.

3. The method of claim 2, wherein the first length $l_{11}$ ranges from approximately 50 nm to approximately 250 nm, the second length $l_{22}$ ranges from approximately 50 nm to approximately 250 nm, the third length $l_{33}$ ranges from approximately 50 nm to approximately 250 nm, the first periods $p_{11}$ range from approximately 100 nm to approximately 500 nm, the second periods $p_{22}$ range from approximately 100 nm to approximately 500 nm, and the third periods $p_{33}$ range from approximately 100 nm to approximately 500 nm.

4. The method of claim 1, further comprising:
creating the plurality of fourth segmented lines by aligning a plurality of fourth segments in a first direction wherein the plurality of fourth segments are separated by fourth separation distances $s_{44}$, a fourth segment having a fourth length $l_{44}$ and a fourth width $w_{44}$, wherein the plurality of fourth segmented lines are separated by fourth periods $p_{44}$; and
creating the plurality of fifth segmented lines by aligning a plurality of fifth segments in a second direction wherein the plurality of fifth segments are separated by fifth separation distances $s_{55}$, a fifth segment having a fifth length $l_{55}$ and a fifth width $w_{55}$, wherein the plurality of fifth segmented lines are separated by fifth periods $p_{55}$.

5. The method of claim 4, wherein the fourth length $l_{44}$ ranges from approximately 50 nm to approximately 250 nm, the fifth length $l_{55}$ ranges from approximately 50 nm to approximately 250 nm, the fourth periods $p_{44}$ range from approximately 100 nm to approximately 500 nm, and the fifth periods $p_{55}$ range from approximately 100 nm to approximately 500 nm.

6. The method of claim 1, further comprising:
establishing a first alignment plane in a first direction and a second alignment plane in a second direction in the first multi-dimensional target;
establishing a third alignment plane in the first direction and a fourth alignment plane in the second direction in the second multi-dimensional target;
determining a first alignment offset in the first direction using the first alignment plane and the third alignment plane;
establishing a first alignment offset limit in the first direction;
determining a second alignment offset in the second direction using the second alignment plane and the fourth alignment plane;
establishing a second alignment offset limit in the second direction;
minimizing a first difference between the first alignment offset and the first alignment offset limit; and
minimizing a second difference between the second alignment offset and the second alignment offset limit.

7. The method of claim 1, further comprising:
establishing a first x-axis alignment plane and a first y-axis alignment plane in the first multi-dimensional target;
establishing a second x-axis alignment plane and a second y-axis alignment plane in the first multi-dimensional target;
determining a first alignment offset using the first x-axis alignment plane and the second x-axis alignment plane;
establishing a first alignment offset limit in a first direction;
determining a second alignment offset using the first y-axis alignment plane and the second y-axis alignment plane;
establishing a second alignment offset limit in a second direction;
minimizing a first difference between the first alignment offset and the first alignment offset limit; and
minimizing a second difference between the second alignment offset and the second alignment offset limit.

8. The method of claim 1, further comprising:
determining a first alignment offset in the first direction using one or more of the third segmented lines in the first multi-dimensional target and one or more of the fourth segmented lines in the second multi-dimensional target, wherein third segmented line elements are wider than fourth segmented line elements;
determining a second alignment offset in the second direction using one or more of the third segmented lines in the first multi-dimensional target and one or more of the fifth segmented lines in the second multi-dimensional target, wherein the third segmented line elements are wider than fifth segmented line elements;
establishing a first alignment offset limit in the first direction;
establishing a second alignment offset limit in the second direction;
minimizing a first difference between the first alignment offset and the first alignment offset limit; and
minimizing a second difference between the second alignment offset and the second alignment offset limit.

9. The method of claim 8, further comprising:
establishing a refined first alignment offset in the first direction using one or more of the first segmented lines in the first multi-dimensional target and one or more of the fourth segmented lines in the second multi-dimensional target;
establishing a refined second alignment offset in the second direction using one or more of the second segmented lines in the first multi-dimensional target and one or more of the fifth segmented lines in the second multi-dimensional target;
minimizing a new first difference between the refined first alignment offset and the first alignment offset limit; and
minimizing a new second difference between the refined second alignment offset and the second alignment offset limit.

10. The method of claim 1, further comprising:
determining a first alignment offset in the first direction using one or more of the third segmented lines in the first multi-dimensional target and one or more of the fourth segmented lines in the second multi-dimensional target, wherein third segmented line elements are wider than fourth segmented line elements;
determining a second alignment offset in the second direction using one or more of the second segmented lines in the first multi-dimensional target and one or more of the fifth segmented lines in the second multi-dimensional target, wherein second segmented line elements are wider than second segmented line;
establishing a first alignment offset limit in the first direction;
establishing a second alignment offset limit in the second direction;
minimizing a first difference between the first alignment offset and the first alignment offset limit; and
minimizing a second difference between the second alignment offset and the second alignment offset limit.

11. A method for creating alignment features for a Double-Patterning (D-P) processing sequence, the method comprising:
selecting one or more first locations on a first mask, the first mask having a first pattern thereon for creating a first set of structures on a wafer using a first D-P processing sequence;
creating a first multi-dimensional target at each of the first locations on the first mask, the first multi-dimensional target comprising a plurality of first segmented lines, a plurality of second segmented lines perpendicular to the plurality of first segmented lines, and a plurality of third segmented lines parallel to the plurality of first segmented lines;
selecting one or more second locations on a second mask, the second mask having a second pattern thereon for creating a second set of structures on the wafer using a second D-P processing sequence; and
creating a second multi-dimensional target at each of the second locations on the second mask, the second multi-dimensional target comprising a plurality of fourth segmented lines, and a plurality of fifth segmented lines perpendicular to the plurality of fourth segmented lines.

12. The method of claim 11, further comprising:
creating the plurality of first segmented lines by aligning a plurality of first segments in a first direction wherein the plurality of first segments are separated by first separation distances $s_{11}$, a first segment having a first length $l_{11}$ and a first width $w_{11}$, wherein the plurality of first segmented lines are separated by first periods $p_{11}$;
creating the plurality of second segmented lines by aligning a plurality of second segments in a second direction wherein the plurality of second segments are separated by second separation distances $s_{22}$, a second segment having a second length $l_{22}$ and a second width $w_{22}$, wherein the plurality of second segmented lines are separated by second periods $p_{22}$; and creating the plurality of third segmented lines by aligning a plurality of third segments in the first direction wherein the plurality of third segments are separated by third separation distances $s_{33}$, a third segment having a third length $l_{33}$ and a third width $w_{33}$, wherein the plurality of third segmented lines are separated by third periods $p_{33}$.

13. The method of claim 12, wherein the first length $l_{11}$ ranges from approximately 50 nm to approximately 250 nm, the second length $l_{22}$ ranges from approximately 50 nm to approximately 250 nm, the third length $l_{33}$ ranges from approximately 50 nm to approximately 250 nm, the first periods $p_{11}$ range from approximately 100 nm to approximately 500 nm, the second periods $p_{22}$ range from approximately 100 nm to approximately 500 nm, and the third periods $p_{33}$ range from approximately 100 nm to approximately 500 nm.

14. The method of claim 11, further comprising:
creating the plurality of fourth segmented lines by aligning a plurality of fourth segments in a first direction wherein the plurality of fourth segments are separated by fourth separation distances $s_{44}$, a fourth segment having a fourth length $l_{44}$ and a fourth width $w_{44}$, wherein the plurality of fourth segmented lines are separated by fourth periods $p_{44}$; and creating the plurality of fifth segmented lines by aligning a plurality of fifth segments in a second direction wherein the plurality of fifth segments are separated by fifth separation distances $s_{55}$, a fifth segment having a fifth length $l_{55}$ and a fifth width $w_{55}$, wherein the plurality of fifth segmented lines are separated by fifth periods $p_{55}$.

15. The method of claim 14, wherein the fourth length $l_{44}$ ranges from approximately 50 nm to approximately 250 nm, the fifth length $l_{55}$ ranges from approximately 50 nm to approximately 250 nm, the fourth periods $p_{44}$ range from approximately 100 nm to approximately 500 nm, and the fifth periods $p_{55}$ range from approximately 100 nm to approximately 500 nm.

16. The method of claim 11, further comprising:
creating a first alignment plane in a first direction and a second alignment plane in a second direction in the first multi-dimensional target;
creating a third alignment plane in the first direction and a fourth alignment plane in the second direction in the second multi-dimensional target;
creating a first alignment offset limit in the first direction; and
creating a second alignment offset limit in the second direction.

17. The method of claim 11, further comprising:
creating a first aligned state for the first multi-dimensional target and the second multi-dimensional target;
calculating a first optical response for the first aligned state, wherein the first optical response is determined for a first direction and for a first set of wavelengths;
creating a plurality of first non-aligned states by offsetting the second multi-dimensional target relative to the first multi-dimensional target, wherein a first separation distance is established in the first direction between the first multi-dimensional target and the second multi-dimensional target; and
calculating one or more first optical responses for each of the first non-aligned states, wherein the one or more first optical responses are determined in the first direction.

18. The method of claim 17, further comprising:
calculating a second optical response for the first aligned state, wherein the second optical response is determined for a second direction and for a second set of wavelengths;
creating a plurality of second non-aligned states by offsetting the second multi-dimensional target relative to the first multi-dimensional target, wherein a second separation distance is established in the second direction between the first multi-dimensional target and the second multi-dimensional target; and
calculating one or more second optical responses for each of the second non-aligned states, wherein the one or more second optical responses are determined in the second direction.

19. The method of claim 11, further comprising:
creating a first aligned state for the first multi-dimensional target and the second multi-dimensional target;
calculating a first optical response for the first aligned state, wherein the first optical response is determined for a first set of wavelengths;
creating a plurality of third non-aligned states by offsetting the second multi-dimensional target relative to the first multi-dimensional target, wherein a first separation distance is established in a first direction between the first multi-dimensional target and the second multi-dimensional target; and
calculating one or more first optical responses for each of the first non-aligned states, wherein the one or more first optical responses are determined in the first direction.

20. A method for calibrating an alignment procedure, comprising:
area having a first multi-dimensional target therein, the first multi-dimensional target comprising a plurality of first segmented lines, a plurality of second segmented lines perpendicular to the plurality of first segmented lines, and a plurality of third segmented lines parallel to the plurality of first segmented lines;
positioning a second mask over the first patterned layer on the wafer, the second comprising a second target area having a second multi-dimensional target therein, the second multi-dimensional target comprising a plurality of fourth segmented lines, and a plurality of fifth segmented lines perpendicular to the plurality of fourth segmented lines; and
creating a plurality of optical response curves by re-positioning the second multi-dimensional target in second mask relative to the first multi-dimensional target in the first patterned layer on the wafer.

* * * * *